(12) United States Patent
Agarwal et al.

(10) Patent No.: US 12,713,955 B2
(45) Date of Patent: Aug. 18, 2026

(54) INTEGRATED CIRCUIT PACKAGES INCLUDING SUBSTRATES WITH STRENGTHENED GLASS CORES

(71) Applicant: Intel Corporation, Santa Clara, CA (US)

(72) Inventors: Soham Agarwal, Chandler, AZ (US); Benjamin T. Duong, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/060,106

(22) Filed: Nov. 30, 2022

(65) Prior Publication Data

US 2024/0178084 A1 May 30, 2024

(51) Int. Cl.

| | |
|---|---|
| ***H01L 23/15*** | (2006.01) |
| ***H01L 21/48*** | (2006.01) |
| ***H01L 23/00*** | (2006.01) |
| ***H01L 23/498*** | (2006.01) |
| ***H01L 25/065*** | (2023.01) |

(52) U.S. Cl.

CPC ............ *H01L 23/15* (2013.01); *H01L 21/486* (2013.01); *H01L 23/49816* (2013.01); *H01L 23/49827* (2013.01); *H01L 24/16* (2013.01); *H01L 24/73* (2013.01); *H01L 25/0655* (2013.01); *H01L 2224/16235* (2013.01); *H01L 2224/73204* (2013.01)

(58) Field of Classification Search

None

See application file for complete search history.

(56) References Cited

U.S. PATENT DOCUMENTS

| | | | | |
|---|---|---|---|---|
| 2006/0279829 | A1* | 12/2006 | Dohrman ............... | B82Y 20/00 359/241 |
| 2007/0001259 | A1 | 1/2007 | Palanduz | |
| 2011/0292133 | A1 | 12/2011 | Sasaki et al. | |
| 2012/0048604 | A1 | 3/2012 | Cornejo et al. | |
| 2017/0250158 | A1 | 8/2017 | Chinnusamy et al. | |
| 2021/0347682 | A1 | 11/2021 | Li et al. | |
| 2023/0369230 | A1 | 11/2023 | Sun et al. | |
| 2024/0178146 | A1* | 5/2024 | Duong .................... | H01L 24/05 |

* cited by examiner

*Primary Examiner* — Kyoung Lee
(74) *Attorney, Agent, or Firm* — Akona IP PC

(57) ABSTRACT

Disclosed herein are microelectronic assemblies including strengthened glass cores, as well as related devices and methods. In some embodiments, a microelectronic assembly may include a core made of glass and having a surface, the core further including a first region having a first concentration of ions and a second region having a second concentration of ions at the surface of the core; and a third region having a third concentration of ions, wherein the second region is between the third region and the surface of the core, and wherein the third concentration of ions is less than the first and second concentrations of ions; a dielectric with a conductive pathway at the surface of the core; and a die electrically coupled to the conductive pathway in the dielectric at the surface of the core by an interconnect.

20 Claims, 15 Drawing Sheets

170-2
195
193
170-1
111
113-1
105
103

170-2
195
197
193
195
170-1
117
111
113-2
107
109
105
103

170-2
191
193
170-1
106
123-1
119
103

170-2
191
193
170-1
106
103

198
199
170-2
193
170-1
106
103
123-2
104

198
199
170-2
193
170-1
106
111
103
104

INTEGRATED CIRCUIT PACKAGES INCLUDING SUBSTRATES WITH STRENGTHENED GLASS CORES

TECHNICAL FIELD

The present disclosure relates to techniques, methods, and apparatus directed to substrates having strengthened glass core for heterogeneous integrated circuit (IC) packaging architecture.

BACKGROUND

Electronic circuits when fabricated on a wafer of semiconductor material, such as silicon, are commonly called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system. Some ICs have specific functionalities, such as memory or processing. Some other ICs have multiple functionalities, such as a system-on-chip (SOC), in which all or most components of a computer or other electronic system are integrated into a single monolithic die.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1A:
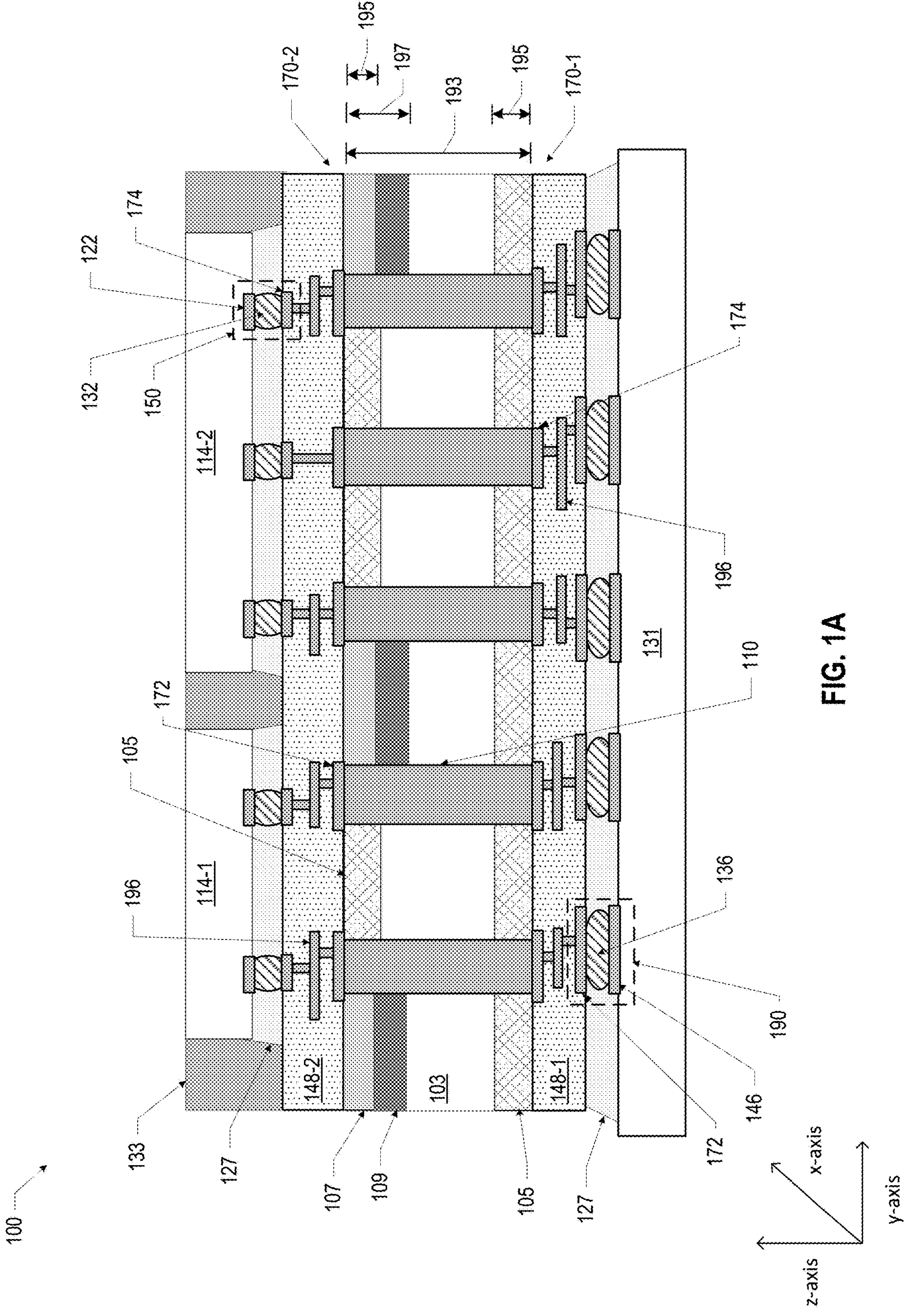
FIG. 1A is a schematic cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in a way that limits the broad scope of the present disclosure and its potential applications.

Die partitioning, in which multiple smaller dies are coupled together by high-density interconnects, may achieve smaller form factors and higher yields than utilizing a single, monolithic die. However, coupling dies together at the fine pitch needed to achieve desired interconnect density has been limited by conventional approaches. For example, the warpage of substrate surfaces that may occur during fabrication can make it difficult to reliably couple dies to a common underlying substrate. In one aspect of the present disclosure, a thin glass core may be incorporated into a package substrate.

The structures and assemblies disclosed herein may include a strengthened glass core with through-glass vias (TGVs) for front-to-back connections. The front and back surfaces of the core may further include a metallization region where the TGVs connect the two metallization regions. A glass core as compared to a conventional epoxy core offers several advantages including higher TGV density, lower signal losses, and lower total thickness variation (TTV), among others. The glass core may be strengthened by using an ion-exchange process or an ion-implantation process on a top and/or bottom surface of the glass core. An IC package, with a strengthened glass core, may be less susceptible to damage resulting from warpage and may mitigate or minimize stress between materials having different coefficients of thermal expansion (CTEs) arising from uneven thermal expansion in the IC package. A metallization region may include a dielectric material with conductive pathways therein may be formed on a surface of the glass core. A dielectric material including conductive pathways also may be referred to herein as a redistribution layer (RDL). The RDLs may provide routing for design flexibility, and the strengthened glass core may provide dimensional stability, allowing the structures and assemblies disclosed herein to exhibit little to no warpage.

Accordingly, disclosed herein are microelectronic assemblies including strengthened glass cores, as well as related devices and methods. In some embodiments, a microelectronic assembly may include a core made of glass and having a surface, the core further including a first region having a first concentration of ions and a second region having a second concentration of ions at the surface of the core; and a third region having a third concentration of ions, wherein the second region is between the third region and the surface of the core, and wherein the third concentration of ions is less than the first and second concentrations of ions; a dielectric with a conductive pathway at the surface of the core; and a die electrically coupled to the conductive pathway in the dielectric at the surface of the core by an interconnect.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are stated in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of input/output (I/O) functions, arithmetic operations, pipelining of data, etc.).

In another example, the terms "package" and "IC package" are synonymous, as are the terms "die" and "IC die." Note that the terms "chip," "chiplet," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., metal oxide semiconductor (MOS) FETs (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer.

Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B).

For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 3A-3E), such a collection may be referred to herein without the letters (e.g., as "FIG. 3"). Similarly, if a collection of reference numerals designated with different numbers are present (e.g., 114-1, 114-2), such a collection may be referred to herein without the numbers (e.g., 114).

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

FIG. 1A is a schematic cross-sectional view of an example microelectronic assembly 100 according to some embodiments of the present disclosure. Microelectronic assembly 100 may include a core 103 having a first region 105 with a first concentration of ions, a second region 107 with a second concentration of ions different than the first concentration of ions, and a third region 109 with a third concentration of ions different than the first and second concentrations of ions. The first, second, and third regions 105, 107, 109 may improve strength of the core 103 and reduce damage resulting from compression and tensile stress. As used herein, the terms "first concentration," "second concentration," and "third concentration" refer to a range of concentrations of ions, not an exact value. A core 103 may have a first surface 170-1 (e.g., a bottom surface) and an opposing second surface 170-2 (e.g., a top surface). In some embodiments, a thickness 193 of a core 103 may be between 200 microns and 3000 microns (i.e., between 200 microns and 3 millimeters). As shown in FIG. 1A, in some embodiments, a core 103 may have a first region 105 at both of the first and second surfaces 170-1, 170-2. In some embodiments, a core 103 may include a first region 105 at only one of the first or second surfaces 170-1, 170-2 (not shown). In some embodiments, a core 103 may have a second region 107 and a third region 109 at only one of the first or second surfaces 170-1, 170-2 (e.g., as shown in FIG. 1A). In some embodiments, a core 103 may have a first region 105, a second region 107, and a third region 109 at both of the first and second surfaces 170-1, 170-2 (e.g., as shown in FIG.

1B). In some embodiments, a first region 105 and a second region 107 may have a depth 195 (e.g., a z-height or a thickness from a respective surface 170 of the core 103) between 2 nanometers and 50 microns, and a third region 107 may have a depth 197 between 2 nanometers and 100 microns, where the second region 107 is between the third region 109 and the surface 170 of the core 103 (e.g., as shown in FIG. 1A, the second surface 170-2). In some embodiments, the first and second regions 105, 107 may have a depth 195 between 2 nanometers and 100 microns, and the third region 109 may have a depth 197 between 2 nanometers and 250 microns. The first, second, and third regions may have any suitable depth, including a maximum depth of no more than 50% of a thickness 193 of the core 103. In some embodiments, a microelectronic assembly 100 may include more than three regions of different ion concentrations at the first and/or second surfaces 170-1, 170-2, including four regions or more than four regions depending on the number of chemical processes a core 103 undergoes. Although FIG. 1A shows the first, second, and third regions 105, 107, 109 as distinct regions, it will be understood that there may be an area of overlap having a gradient of ion concentrations between the respective regions.

The first, second, and third regions 105, 107, 109 may have different concentrations of a same ion. For example, a first region 105 having a first concentration of first ions may be formed by performing a first chemical process to implant or exchange ions (e.g., using equipment that energizes and implants ions or that exchanges ions, as described below with reference to FIG. 3), a second region 107 having a second concentration of ions may be formed by performing a second ion-implant process, such as a laser treatment, as described below with reference to FIG. 4, to implant the ions further into the core 103 forming a third region 109 having a third concentration of ions. The first concentration of ions in the first region 105 is greater than the second concentration of ions in the second region 107 and greater than the third concentration of ions in the third region 109. The second and third concentrations of ions in the respective second and third regions 107, 109 may have a same concentration of ions or may have different concentrations of ions that are less than the first concentration of ions. Example ions of elements to be implanted may include nitrogen, hydrogen, helium, copper, nickel, gold, silver, titanium, oxygen, carbon, boron, phosphorus, arsenic, gallium, or argon, and combinations thereof. In some embodiments, first, second, and/or third regions 105, 107, 109 may have ion concentrations between $10^{12}$ atoms/cm$^3$ and $10^{20}$ atoms/cm$^3$. The particular ions and concentration of ions in the first, second, and third regions 105, 107, 109 may be analyzed and identified using any suitable technique, such as energy-dispersive X-ray spectroscopy (EDX). Although FIG. 1A illustrates different concentrations of a single ion, the first, second, and third regions 105, 107, 109 may include additional concentrations of ions that are not shown. Further, although FIG. 1A illustrates different concentrations of a single ion, the first region 105 at the first surface 170-1 may have a different ion than the first region 105 at the second surface 170-2, for example, the first region 105 at the first surface 170-1 may have first ions (e.g., nickel ions) and the first region 105 at the second surface 170-2 may have second ions (e.g., copper ions). In some embodiments, a region (e.g., first, second, and third regions 105, 107, 109 at the second surface 170-2) may not be continuous along a surface of the core 103. In some embodiments, a region (e.g., a first region 105 at the first surface 170-1) may be continuous along a surface of the core 103.

A material of the core 103 may include glass, such as, bulk transparent glass, which is different from fiberglass typically used in reinforced epoxy cores for package substrates or motherboards. Moreover, in various embodiments, the glass of core 103 is not explicitly combined with any organic material but rather comprises any type of bulk amorphous or polycrystalline transparent, opaque, or semi-transparent glass, including fused silica, borosilicate glass, soda-lime glass, ceramic glass, etc.

Figures 1B, 1C:
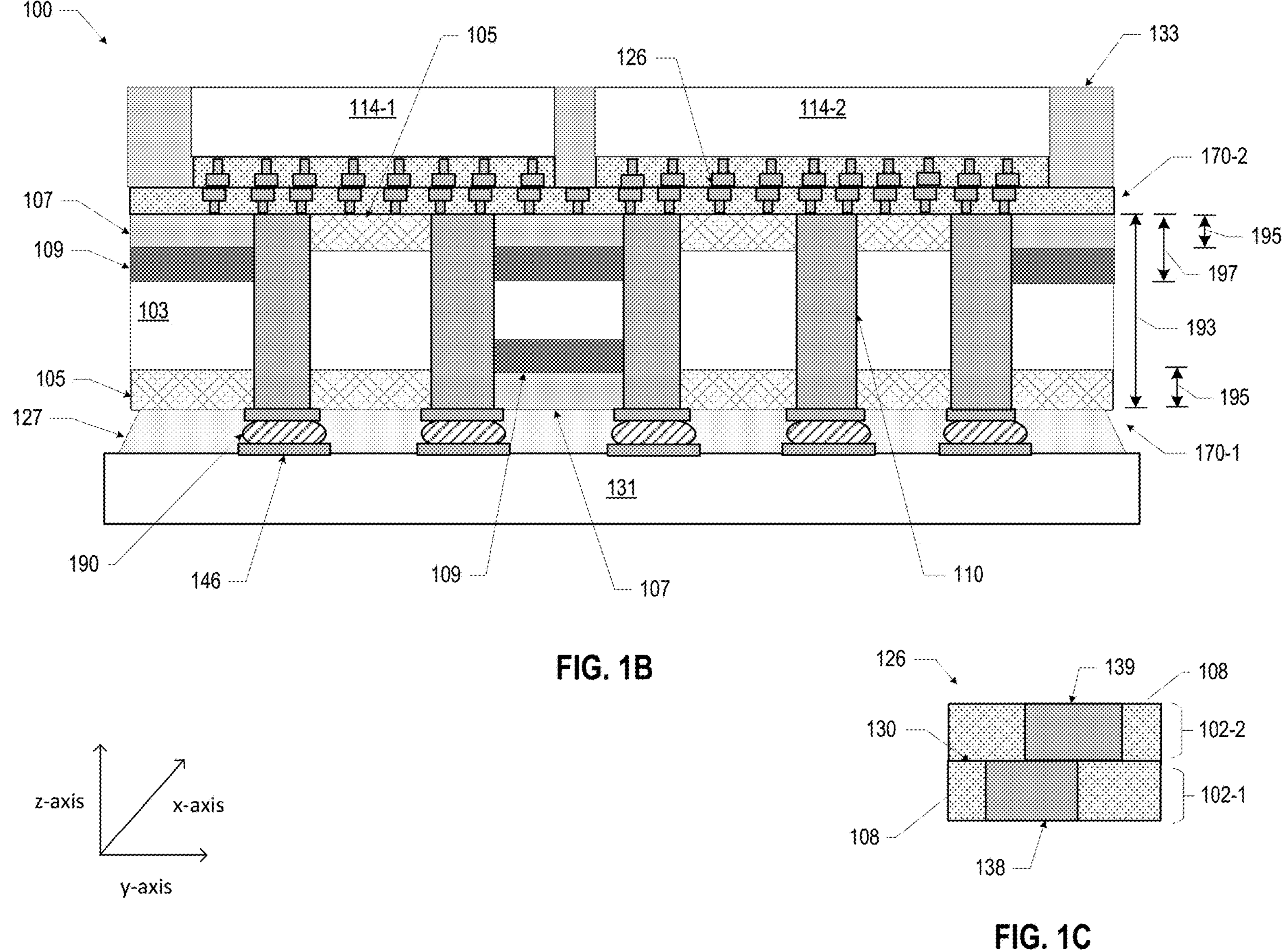
FIG. 1B is a schematic cross-sectional view of another example microelectronic assembly according to some embodiments of the present disclosure.
FIG. 1C is a schematic cross-sectional view of an example detail of a conductive interconnect bonding interface of the example microelectronic assembly of FIG. 1B according to some embodiments of the present disclosure.

The microelectronic assembly 100 may further include a first RDL 148-1 at the first surface 170-1 of the core 103 and a second RDL 148-2 at the second surface 170-2 of the core 103. The first and second RDLs 148-1, 148-2 may include conductive pathways 196 (e.g., including conductive traces and/or conductive vias, as shown) through a dielectric material. The RDLs 148 may include a set of first conductive contacts 172 on the bottom surface of the RDL 148 and a set of second conductive contacts 174 on the top surface of the RDL 148, where the conductive pathways 196 electrically couple individual ones of the first and second conductive contacts 172, 174. The first and second RDLs 148-1, 148-2 may be manufactured using any suitable technique, such as a PCB technique or a redistribution layer technique. In some embodiments, a dielectric material of the RDL 148 may include bismaleimide triazine (BT) resin, polyimide materials, epoxy materials (e.g., glass reinforced epoxy matrix materials, epoxy build-up films, or the like), mold materials, oxide-based materials (e.g., silicon dioxide or spin on oxide), or low-k and ultra low-k dielectric (e.g., carbon-doped dielectrics, fluorine-doped dielectrics, porous dielectrics, and organic polymeric dielectrics). The core 103 may further include one or more TGVs 110 electrically coupling the first and second RDLs 148-1, 148-2. As used herein, the core 103 with the second RDL 148-2 and/or the first RDL 148-1 may be referred to as a package substrate. In some embodiments, the first and/or second RDLs 148-1, 148-2 may be omitted (e.g., as shown in FIG. 1B).

One or more TGVs 110 in core 103 may enable power, ground and signal connectivity to components located on either side of the core 103, for example, between dies 114-1, 114-2 and a circuit board 131. TGVs 110 may have any suitable size and shape. TGVs 110 is shown as having straight, parallel edges; however, in various embodiments, the edges may be tapered and/or have other irregularities depending on the processing conditions for generating TGVs 110. TGVs 110 may be formed using any suitable process, including, for example, laser drilling via openings through the core 103 and depositing a conductive material in the openings. TGVs 110 may be formed of any suitable conductive material, such as copper, silver, nickel, gold, aluminum, or other metals or alloys, for example. In some embodiments, the pitch of the TGVs 110 may be between 75 microns and 200 microns (e.g., between 75 microns and 150 microns). In some embodiments, the diameters of the TGVs 110 may be between 35 microns and 100 microns (e.g., between 35 microns and 75 microns).

The microelectronic assembly 100 may further include die 114-1 and die 114-2 electrically coupled to a top surface of the second RDL 148-2 by interconnects 150. In particular, conductive contacts 122 on a bottom surface of die 114-1, 114-2 may be electrically and mechanically coupled to conductive contacts 174 at a top surface of the second RDL 148-2 by interconnects 150.

Interconnects 150 may enable electrical coupling between die 114-1 and die 114-2 through conductive pathways 196 in RDL 148-2. Interconnects 150 disclosed herein may take any suitable form, including solder balls for a ball grid array arrangement, pins in a pin grid array arrangement or lands in a land grid array arrangement. In some embodiments, a set of interconnects 150 may include solder 132 (e.g., solder bumps or balls that are subject to a thermal reflow to form the interconnects 150). Interconnects 150 that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of interconnects 150 may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression. In some embodiments, interconnects 150 disclosed herein may have a pitch between about 18 microns and 75 microns.

The die 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, polyimide materials, glass reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways in a die 114 may include conductive traces and/or conductive vias, and may connect any of the conductive contacts in the die 114 in any suitable manner (e.g., connecting multiple conductive contacts on a same surface or on different surfaces of the die 114). The conductive pathways in the dies 114 may be bordered by liner materials, such as adhesion liners and/or barrier liners, as suitable. In some embodiments, the die 114 is a wafer. In some embodiments, the die 114 is a monolithic silicon, a fan-out or fan-in package die, or a die stack (e.g., wafer stacked, die stacked, or multi-layer die stacked). In various embodiments, die 114 may include, or be a part of, one or more of a central processing unit (CPU), a memory device (e.g., a high-bandwidth memory device), a logic circuit, input/output circuitry, a transceiver such as a field programmable gate array transceiver, a gate array logic such as a field programmable gate array logic, of a power delivery circuitry, a III-V or a III-N device such as a III-N or III-N amplifier (e.g., GaN amplifier), Peripheral Component Interconnect Express (PCIe) circuitry, Double Data Rate (DDR) transfer circuitry, or other electronic components known in the art. In some embodiments, die 114-1 and die 114-2 may comprise different functionalities. As used herein, the term "functionality" with reference to a die refers to one or more functions (e.g., capability, task, operation, action, instruction execution, etc.) that the die in question can perform. For example, die 114-1 may be a CPU and die 114-2 may be a Graphics Processing Unit (GPU) or memory. In other embodiments, die 114-1 and die 114-2 may comprise the same or similar functionalities. For example, IC die 114-1 and die 114-2 may each comprise memory.

The microelectronic assembly 100 of FIG. 1A may also include an insulating material 133 that encapsulates the die 114 (e.g., on and around die 114 and interconnects 150). The insulating material 133 may extend from a top surface of the second RDL 148-2 to a top surface of the die 114. In some embodiments, the insulating material 133 may be a mold material, such as an organic polymer with inorganic silicon oxide or aluminum oxide particles, a resin material, or an epoxy material. In some embodiments (not shown) other components, such as heat sinks may be coupled to microelectronic assembly 100 based on particular needs.

The microelectronic assembly 100 of FIG. 1A may also include an underfill material 127. In some embodiments, the underfill material 127 may extend between die 114-1, 114-2 and the second RDL 148-2 around the associated interconnects 150. The underfill material 127 may be an insulating material, such as an appropriate epoxy material. In some embodiments, the underfill material 127 may include a capillary underfill, non-conductive film (NCF), or molded underfill. In some embodiments, the underfill material 127 may include an epoxy flux that assists with soldering die 114-1, 114-2 to the second RDL 148-2 when forming the interconnects 150, and then polymerizes and encapsulates the interconnects 150. The underfill process may include dispensing underfill material in liquid form, allowing the material to flow and fill the interstitial gaps around interconnects 150, and subjecting the assembly to a curing process, such as baking, to solidify the material. In some embodiments, an underfill material 127 may be omitted. Although FIG. 1A shows two separate underfill 127 portions under die 114-1 and die 114-2, the underfill 127 may be a single underfill 127 under die 114-1 and die 114-2. The underfill material 127 may be selected to have a coefficient of thermal expansion (CTE) that may mitigate or minimize the stress between die 114 and the second RDL 148-2 arising from uneven thermal expansion in the microelectronic assembly 100. In some embodiments, the CTE of the underfill material 127 may have a value that is intermediate to the CTE of the second RDL 148-2 (e.g., the CTE of the dielectric material of the RDL 148) and a CTE of the insulating material of die 114.

The microelectronic assembly 100 of FIG. 1A may also include a circuit board 131. In particular, conductive contacts 172 on a bottom surface of the first RDL 148-1 may be electrically coupled to conductive contacts 146 on a top surface of circuit board 131 by interconnects 190. Interconnects 190 disclosed herein may take any suitable form, including any of the forms described above with reference to interconnects 150. As shown in FIG. 1A, in some embodiments, a set of interconnects 190 may include solder 136 (e.g., solder bumps or balls that are subject to a thermal reflow to form the interconnects 190). In some embodiments, the interconnects 190 disclosed herein may have a pitch between about 50 microns and 300 microns. In some embodiments, an underfill material 127 may extend between the first RDL 148-1 and the circuit board 131 around the associated interconnects 190. The circuit board 131 may be a motherboard, for example, and may have other components attached to it. The circuit board may include conductive pathways and other conductive contacts for routing power, ground, and signals through the circuit board, as known in the art. In some embodiments, the interconnects 190 may not couple to a circuit board 131, but may instead couple to another IC package, an interposer, or any other suitable component.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

FIG. 1B is a schematic cross-sectional view of another example microelectronic assembly 100 according to some embodiments of the present disclosure. The configuration of the embodiment shown in the figure is like that of FIG. 1A, except for differences as described further. The configuration of microelectronic assembly 100 as described herein includes a core 103 having a first region 105 with a first concentration of ions, a second region 107 with a second concentration of ions, and a third region 109 with a third concentration of ions on the first and second surfaces 170-1, 170-2 of the core 103. The first, second, and third regions 105, 107, 109 may improve tensile strength of the core 103. As shown in FIG. 1B, a core 103 may have a first region 105, a second region 107, and a third region 109 at both first and second surfaces 170-1, 170-2 of the core 103. The first, second, and third regions 105, 107, 109 may have different concentrations of a same ion. In some embodiments, the first, second, and third regions 105, 107, 109 at the first surface 170-1 may have different concentrations of a first ion and the first, second, and third regions 105, 107, 109 at the second surface 170-1 may have different concentrations of a second ion, the second ion being different than the first ion.

FIG. 1C is a schematic cross-sectional view of a detail of a particular one of interconnects 126 in microelectronic assembly 100 of FIG. 1B. Note that although only interconnect 126 is shown, the same structure and description may apply to any other such interconnects comprising hybrid bonds in microelectronic assembly 100 where applicable, for example, a photoimageable dielectric (PID) with copper-to-copper bonding or a liquid metal ink (LMI) interconnect. In a general sense, interconnect 126 may include, at an interface 130 between layers 102-1 and 102-2, metal-metal bonds between bond-pad 138 of layer 102-1 and bond-pad 139 of layer 102-2, and dielectric-dielectric bonds (e.g., oxide-oxide bonds) in a dielectric material 108 of layers 102-1 and 102-2. In some embodiments, the layer 102-2 may be included in die 114 and layer 102-1 may be included in core 103. Bond-pad 138 of layer 102-1 may bond with bond-pad 139 of layer 102-2. Dielectric material 108 in layers 102-1 and 102-2 may bond with each other. A dielectric material 108 may include organic materials or inorganic materials, for example, silicon and one or more of oxygen, nitrogen, and carbon (e.g., in the form of silicon oxide, silicon nitride, or silicon carbide), and/or other forms of inorganic dielectric material typically used as interlayer dielectric (ILD) in semiconductor devices. The bonded metal and dielectric materials form interconnect 126, comprising hybrid bonds, providing electrical and mechanical coupling between layers 102-1 and 102-2. In various embodiments, interconnects 126 may have a linear dimension of less than 5 micrometers and a pitch of less than 10 microns between adjacent interconnects. In some embodiments, interconnects 126 may have a pitch between 2 microns and 45 microns between adjacent interconnects (e.g., between 2 microns and 10 microns, between 10 microns and 30 microns, or between 25 microns and 45 microns). Interconnects 126 to be formed between the core 103 and a die 114 without forming an RDL 148, which may cause additional compression and tensile stress to the core 103.

Figures 1D, 1E:
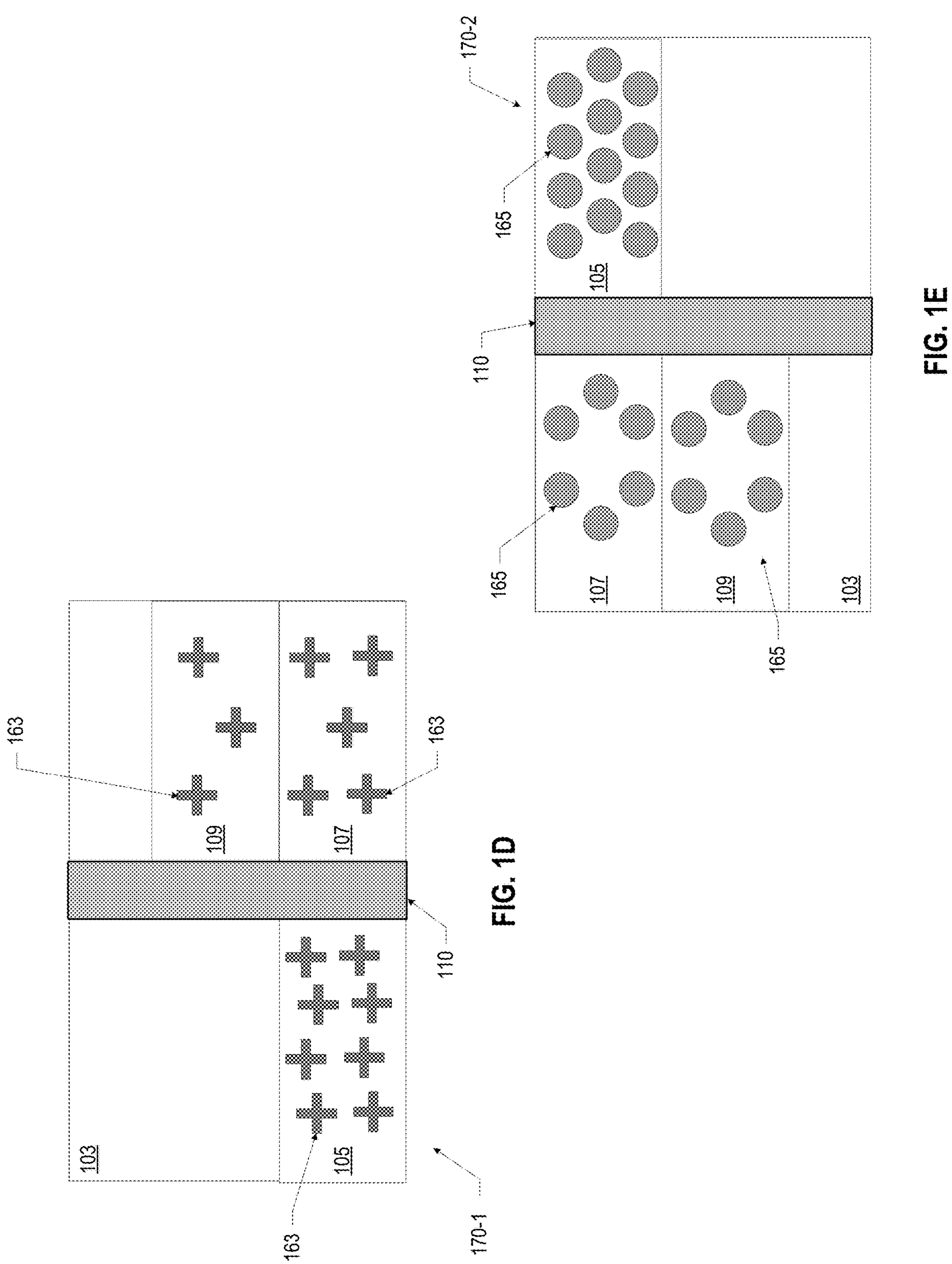
FIGS. 1D and 1E are simplified cross-sectional views of portions of FIG. 1B according to some embodiments of the present disclosure.

FIGS. 1D and 1E are simplified cross-sectional views of portions of first, second, and third regions 105, 107, 109 of core 103 of FIG. 1B. FIG. 1D illustrates different concentrations of first ions 163 in the first, second, and third regions 105, 107, 109 at the first surface 170-2 of the core 103, and FIG. 1E illustrates different concentrations of second ions 165 in the first, second, and third regions 105, 107, 109 at the second surface 170-1 of the core 103. FIG. 1D illustrates a first ion 163 having a first concentration in the first region 105, a second concentration in the second region 107, and a third concentration in the third region 109, where the first, second, and third concentrations are different, the first concentration is greater than the second and third concentrations, and the second concentration is greater than the third concentration. FIG. 1E illustrates a second ion 165 having a first concentration in the first region 105, a second concentration in the second region 107, and a third concentration in the third region 109, where the first concentration is greater than the second, and third concentrations, and the second and third concentrations are the same. Although FIGS. 1D and 1E illustrate only two ions (e.g., first and second ions 163, 165), the first, second, and third regions 105, 107, 109 may include additional concentrations of ions that are not shown.

Figure 2:
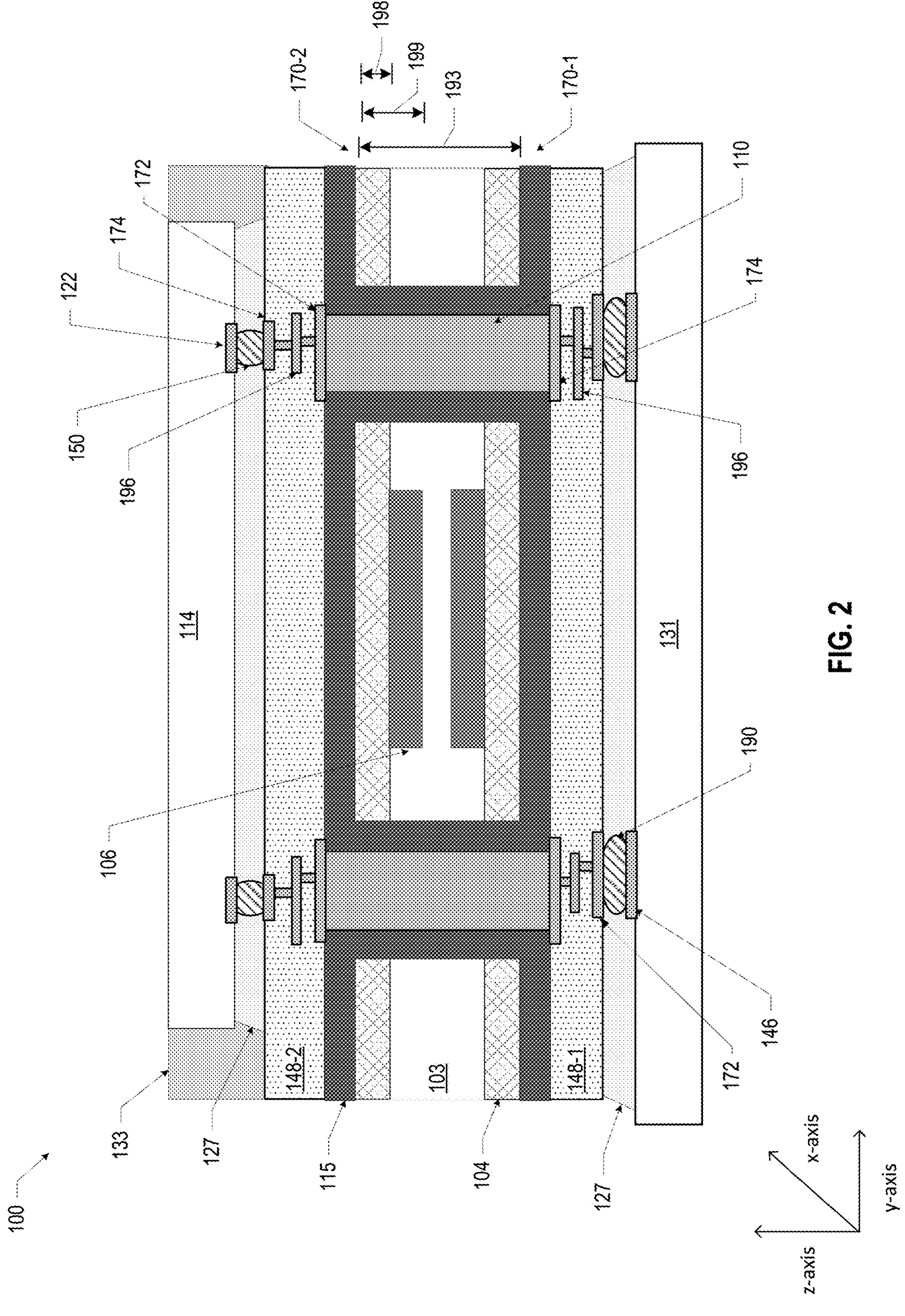
FIG. 2 is a schematic cross-sectional view of yet another example microelectronic assembly according to some embodiments of the present disclosure.

FIG. 2 is a schematic cross-sectional view of another example microelectronic assembly 100 according to some embodiments of the present disclosure. The configuration of the embodiment shown in the figure is like that of FIG. 1A, except for differences as described further. The configuration of microelectronic assembly 100 as described herein includes a core 103 having a first region 106 with a first concentration of ions, a second region 104 with a second concentration of ions, and a material 115 on first and second surfaces 170-1, 170-2 of the core 103 and extending along a lateral surface of TGVs 110 between the first and second surfaces 170-1, 170-2 of the core 103. Example ions in first and second regions 106, 104 include metal nanoparticles. The material 115 may include a barrier material, such as silicon and nitrogen (e.g., in the form of silicon nitride), silicon and oxygen (e.g., in the form of silicon oxide), tantalum, tantalum and nitrogen (e.g., in the form of tantalum nitride), or titanium and nitrogen (e.g., in the form of titanium nitride), to reduce conductivity of metal ions of the first and second regions 104, 106 with the conductive material of the TGVs 110. A thickness of the barrier layer may be between 2 microns and 2-microns. The first and second regions 104, 106 may improve a strength of the core 103. The first and second regions 104, 106 may be formed by exposing the core 103 to first and second ion-implant processes, respectively, as described below with reference to FIG. 4. As shown in FIG. 2, a core 103 may have first and second regions 104, 106 at first and second surfaces 170-1, 170-2. In some embodiments, a core 103 may have first and second regions 104, 106 at a first surface 170-1 or at a second surface 170-2 (not shown). In some embodiments, a first region 104 may have a depth 198 (e.g., a z-height from a respective surface 170 of the core 103) between 2 nanometers and 50 microns), and a second region 107 may have a depth 199 (e.g., a z-height from a respective surface 170 of the core 103) between 2 nanometers and 100 microns). Although FIG. 2 shown the second region 106 with a smaller width (e.g., y-dimension) as compared to the first region 104, a second region 106 may have any suitable width and may have a same width as a first region 104. In some embodiments, a microelectronic assembly 100 may include more than two regions of different ion concentrations, including three regions or more than three regions. In some embodiments, the first region 104 may have a first concentration of first ions and the second region 106 may have a second concentration of second ions, where the first ions are different than the second ions (e.g., first ions may include copper nanoparticles and second ions may include gold nanoparticles).

Any suitable techniques may be used to manufacture the microelectronic assemblies 100 disclosed herein. For example, FIGS. 3A-3E are side, cross-sectional views of various stages in an example process for manufacturing the microelectronic assembly 100 of FIG. 1A, in accordance with various embodiments. Although the operations discussed below with reference to FIGS. 3A-3E (and others of the accompanying drawings representing manufacturing processes) are illustrated in a particular order, these operations may be performed in any suitable order. Further, additional operations which are not illustrated may also be performed without departing from the scope of the present disclosure. Also, various ones of the operations discussed herein with respect to FIGS. 3A-3E may be modified in accordance with the present disclosure to fabricate others of microelectronic assembly 100 disclosed herein.

Figures 3A, 3B:
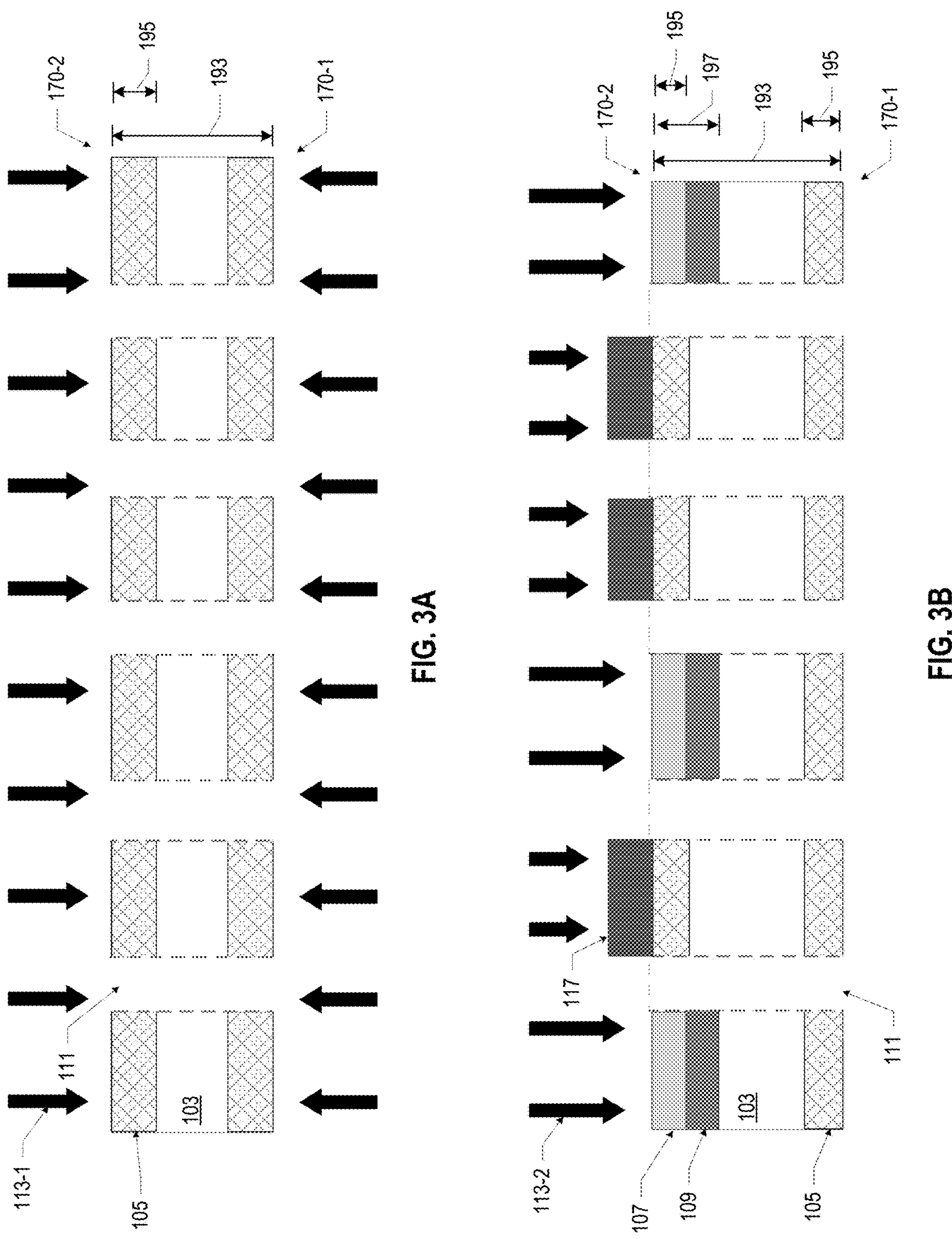
FIGS. 3A-3E are simplified cross-sectional views illustrating various manufacturing steps of an example microelectronic assembly according to some embodiments of the present disclosure.

FIG. 3A illustrates a core 103 including a first surface 170-1, an opposing second surface 170-2, and via openings 111 through the core 103 subsequent to exposing the first and second surfaces 170-1, 170-2 of the core to a first chemical process 113-1, such as an ion-implant process or an ion-exchange process, to form a first region 105 having a first concentration of ions. A core 103 may have a thickness 193, as described above with reference to FIG. 1. In some embodiments, an ion-implant process may have an energy range between 10 kilo electron volts (keV) and 3 mega electron volts (MeV). A depth 195 of the first region 105 and a concentration of the ions may be determined by an intensity and a duration of the implant energy during the ion-implant process. In some embodiments, a first chemical process 113-1 may include an ion-exchange bath having ions that are exchangeable with ions in the core 103, where the assembly is submersed in the ion-exchange bath at a temperature and for a duration to form the first region 105. A depth and a concentration of the ions of the first region 105 may be determined by the temperature, the duration, and the ion concentration of the ion-exchange bath. For example, a temperature may be between 400° C. (Celsius) and 500° C. and a duration may be between 30 minutes and 2 hours. In some embodiments, a mask, such as a mask 117 described with reference to FIG. 3B, may be applied prior to the first chemical process 113-1 (e.g., to pattern the first region 105) and removed subsequent to the formation of the first region 105. In some embodiments, core 103 may not include via openings 111 and the via openings 111 may be formed subsequently, as described below with reference to FIG. 3D.

FIG. 3B illustrates an assembly subsequent to depositing a mask 117 on the first surface 170-1 of the core 103, and exposing the first surface 170-1 of the core 103 to a second chemical process 113-2 to form a second region 107 having a second concentration of ions and a third region 109 having a third concentration of ions. A second chemical process 113-2 may include a laser treatment, such as, an excimer (e.g., ultraviolet light) laser process, a femtosecond laser process, or a picosecond laser process, that moves the ions from the first region 105 deeper into the core 103 to form the third region 109. The second region 105 may be formed by moving ions from the first region 105 to the third region 109. A depth 197 of the third region 107 and a concentration of the ions may be determined by an intensity and a duration of the laser energy during the second chemical process 113-2. The mask 117 may include a soft mask (e.g., a photoresist material that is deposited and patterned) or a hard mask (e.g., a metal material such as copper that is deposited in a pattern). For a first chemical process 113-1 of FIG. 3A that includes an ion-implant process, a shadow mask (e.g., a physical barrier such as a frame) also may be used. In some embodiments, for example, if a selective laser treatment is used, a mask 117 may be omitted.

Figure 3C:
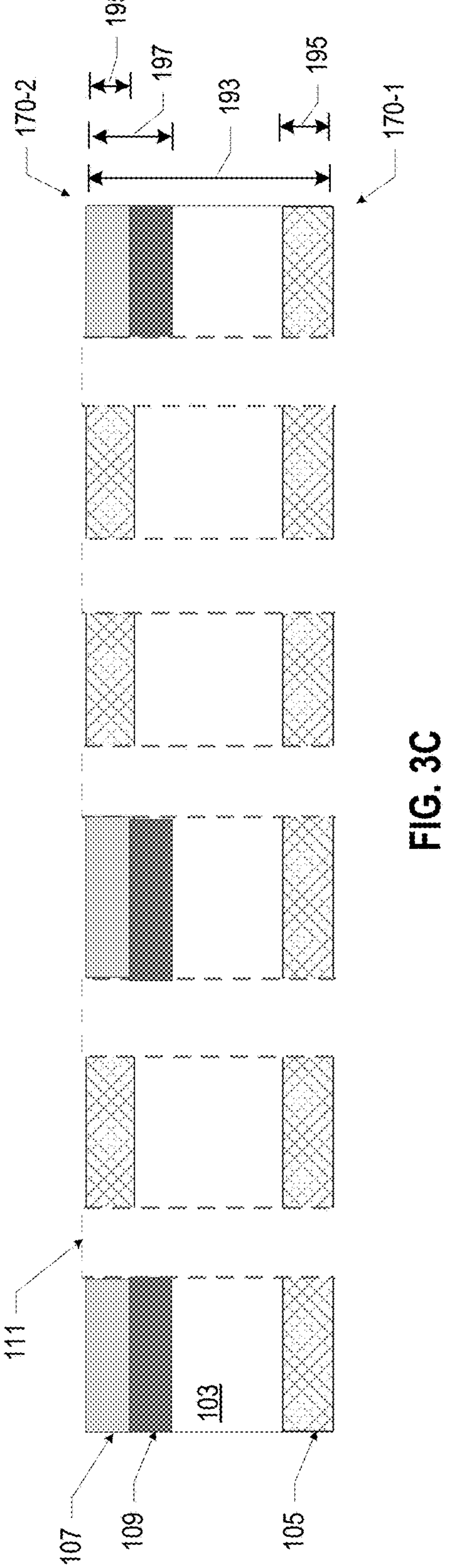

FIG. 3C illustrates an assembly subsequent to removing the mask 117. The mask 117 may be removed using any suitable process such as etching or grinding. The processes described in FIGS. 3A-3C may be repeated any number of times to form additional regions of ion concentrations.

Figure 3D:
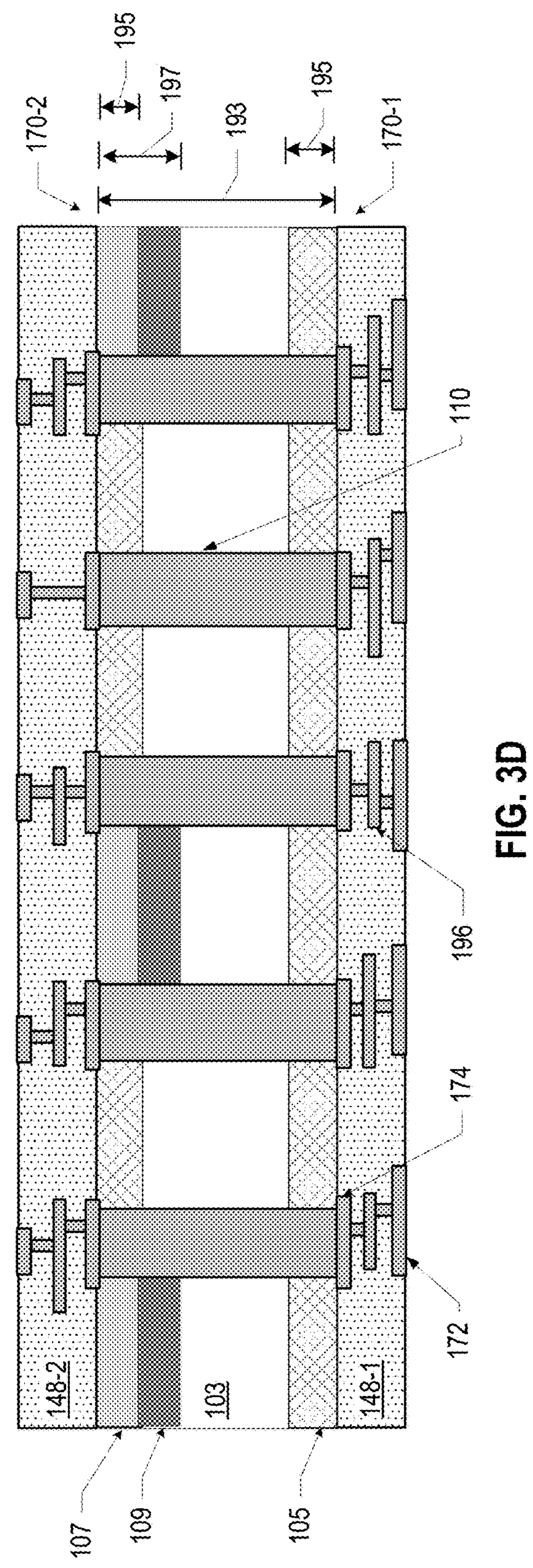

FIG. 3D illustrates an assembly subsequent to plating a conductive material, such as copper, in the via openings 111 of FIG. 3C to form TGVs 110, and forming a first RDL 148-1 on the first surface 170-1 of the core 103 and a second RDL 148-2 on the second surface 170-2 of the core 103. In some embodiments, excess conductive material deposited in the via openings 111 may be polished off the first and/or second surfaces 170-1, 170-2 of the core 103. The RDLs 148, including the first and second RDLs 148-1, 148-2, may include conductive pathways 196 between first conductive contacts 172 and second conductive contacts 174. The RDL 148 may be manufactured using any suitable technique, such as a PCB technique or a redistribution layer technique. If the core 103 does not include via openings 111, via openings 111 may be formed, subsequent to the first chemical process 113-1, the second chemical process 113-2, or any subsequent chemical processes 113, using any suitable process, including by drilling holes in the through the core 103. In some embodiments, a crack-free laser-based drilling process may be used to drill the via openings 111 at a desired pitch and diameter.

Figure 3E:
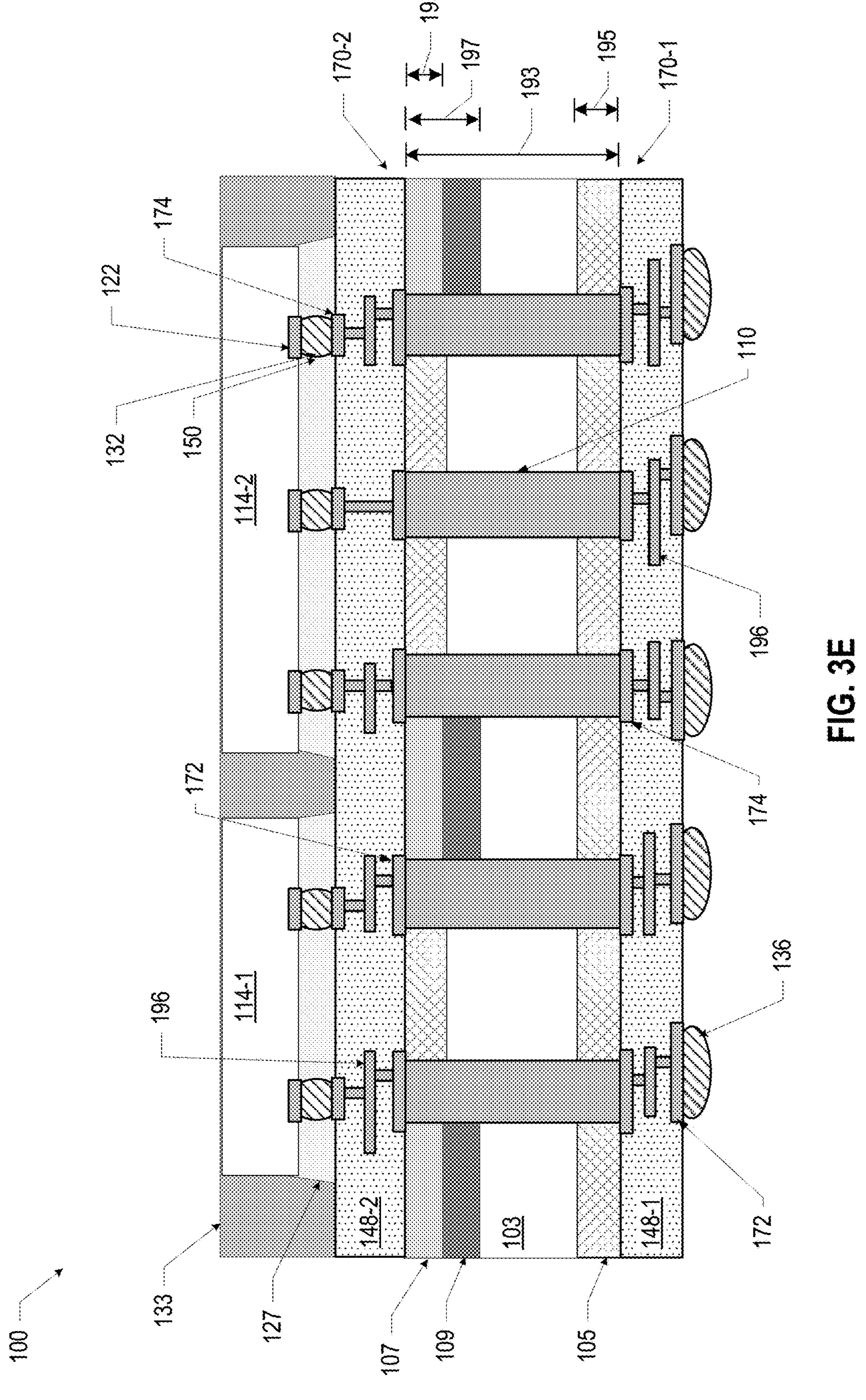

FIG. 3E illustrates an assembly subsequent to electrically coupling the dies 114-1, 114-2 to the second RDL 148-2 by forming interconnects 150, overmolding the dies 114 with an insulating material 133, and performing finishing operations. Any suitable method may be used to place die 114, for example, automated pick-and-place. The assembly of FIG. 3E may be subjected to a solder reflow process during which solder (e.g., solder 132 of FIG. 1A) of the interconnects 150 melt and bond to mechanically and electrically couple die 114 to the second RDL 148-2. In some embodiments, the insulating material 133 may be deposited to completely cover the dies 114 and the overburden of insulating material 133 may be removed to expose a top surface of the dies 114. The insulating material 133 may be removed using any suitable technique, including etching, mechanical milling, or laser ablation. In some embodiments, an underfill material 127 may be deposited around interconnects 150 prior to overmolding with the insulating material 133. Multiple assemblies may be manufactured together and may be singulated. The multiple assemblies may be singulated using any suitable process, such as a glass dice saw or a laser. Example finishing operations include depositing solder resist (not shown) and depositing solder 136 on a bottom surface of conductive contacts 172 of the first RDL 148-1. The assembly of FIG. 3E may itself be a microelectronic assembly 100, as shown. Further manufacturing operations may be performed on the microelectronic assembly 100 of FIG. 3E to form other microelectronic assembly 100. For example, the solder 136 of microelectronic assembly 100 of FIG. 3E may be electrically coupled to a circuit board 131 to form interconnects 190, similar to the microelectronic assembly 100 of FIG. 1A.

Figures 4A, 4B:
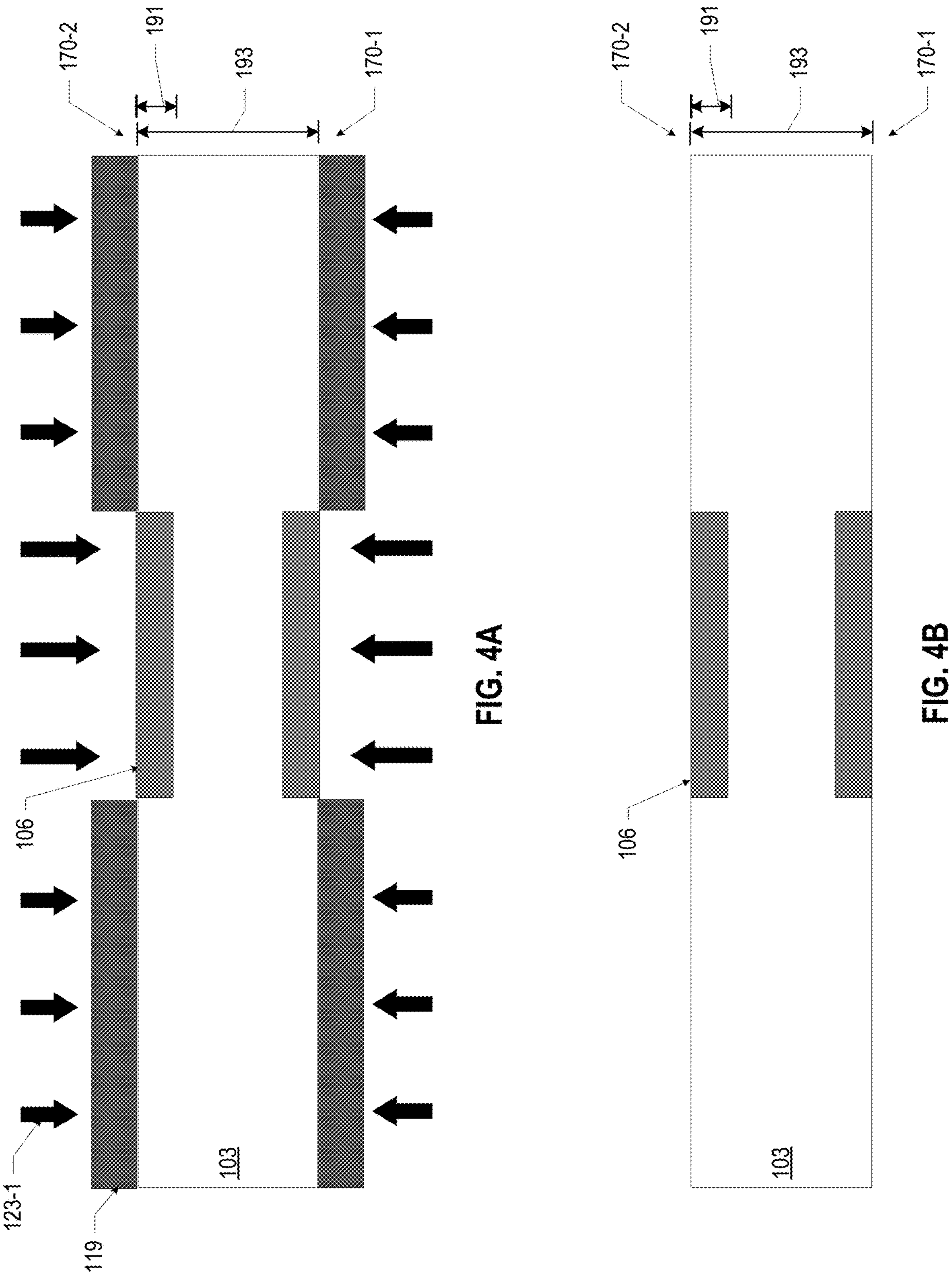
FIGS. 4A-4G are simplified cross-sectional views illustrating various manufacturing steps of an example microelectronic assembly according to some embodiments of the present disclosure.

FIGS. 4A-4G are side, cross-sectional views of various stages in another example process for manufacturing the microelectronic assembly 100 of FIG. 2, in accordance with various embodiments. FIG. 4A illustrates a core 103 subsequent to depositing a mask 119 on a first surface 170-1 and an opposing second surface 170-2 of the core 103 and exposing the first and second surfaces 170-1, 170-2 of the core 103 to a first chemical process 123-1, such as a first ion-implant process, to form a second region 106 having a second concentration of ions. A core 103 may have a thickness 193, as described above with reference to FIG. 1. In some embodiments, the implanted ions include metal nanoparticles. In some embodiments, an ion-implant process may have an energy range between 10 kilo electron volts (keV) and 3 mega electron volts (MeV). A depth 191 of the second region 106 and a concentration of the ions may be determined by an intensity and a duration of the implant energy during the ion-implant process. A mask 119 may include a soft mask (e.g., a photoresist material that is deposited and patterned), a hard mask (e.g., a metal material such as copper that is deposited in a pattern), or a shadow mask (e.g., a physical barrier such as a frame). In some embodiments, core 103 may include via openings 111.

FIG. 4B illustrates an assembly subsequent to removing the mask 119. The mask 119 may be removed using any suitable process such as etching or grinding.

Figures 4C, 4D:
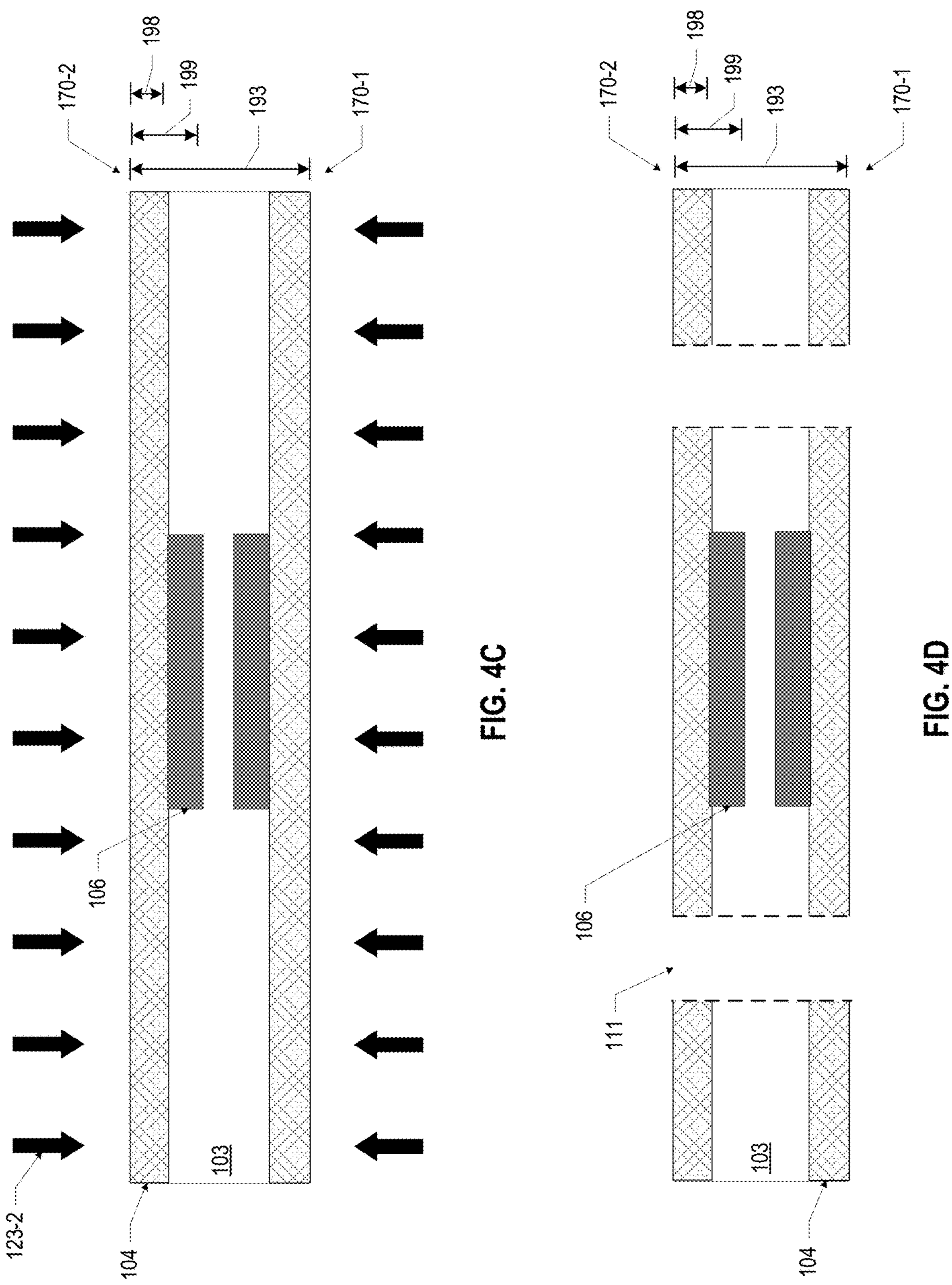

FIG. 4C illustrates an assembly subsequent to exposing the first and second surfaces 170-1, 170-2 of the core 103 to a second chemical process 123-2 to form a first region 104 having a first concentration of ions. A second chemical process 123-2 may include a second ion-implant process that forms the first region 104 having a first concentration of ion and moves the second region 106 deeper into the core 103 (e.g., to a depth 199). A depth 198 of the first region 104 and a concentration of the ions, and the depth 199 of the second region may be determined by an intensity and a duration of the laser energy during the second chemical process 123-2. The processes described in FIGS. 4A-4C may be repeated any number of times to form additional regions of ion concentrations.

FIG. 4D illustrates an assembly subsequent to forming via openings 111 in the assembly of FIG. 4C. Via openings 111 may be formed using any suitable process, including by drilling holes in the through the core 103. In some embodiments, a crack-free laser-based drilling process may be used to drill the via openings 111 at a desired pitch and diameter.

Figures 4E, 4F:
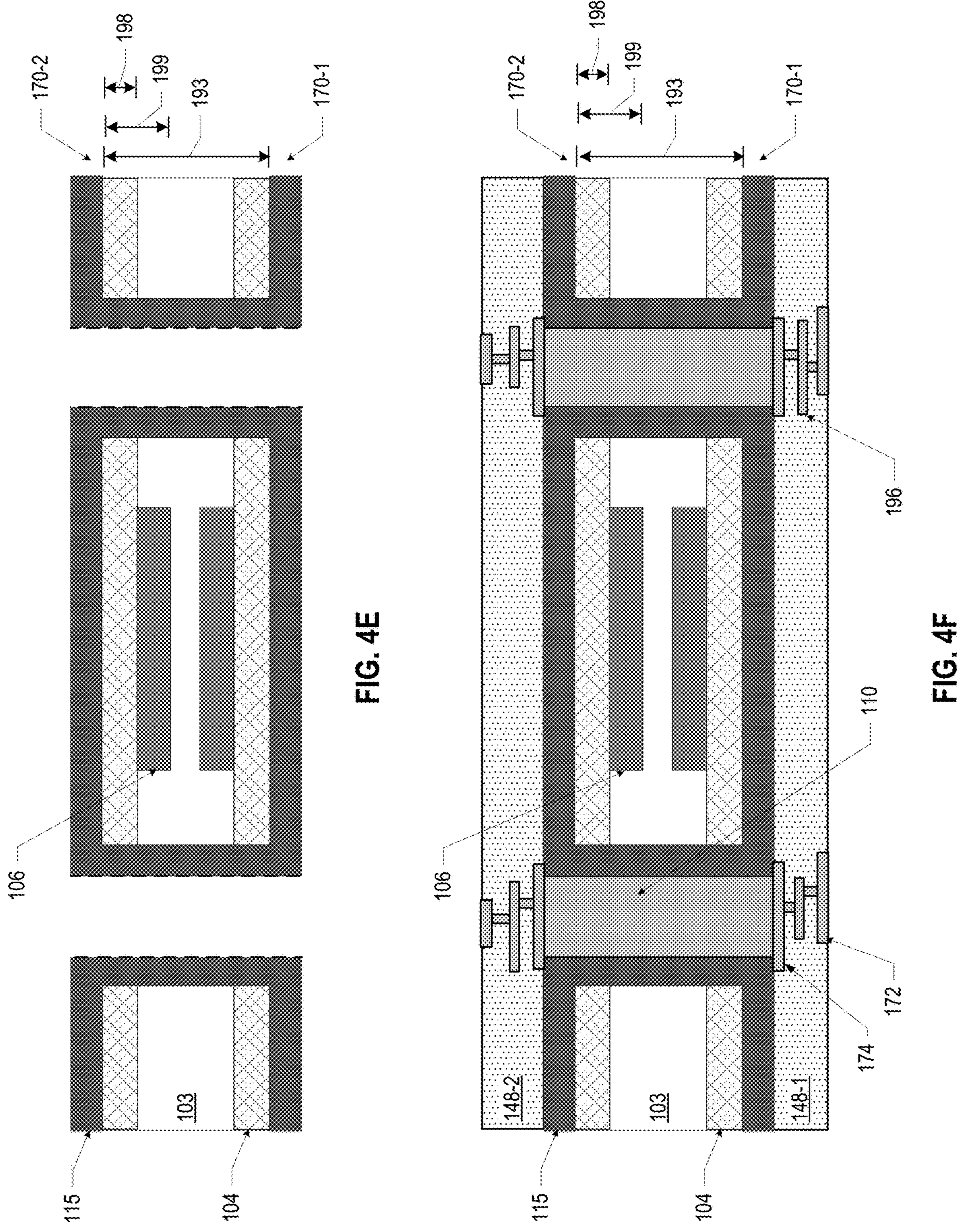

FIG. 4E illustrates an assembly subsequent to depositing a barrier material 115 in the via openings 111 and on the first and second surfaces 170-1, 170-2 of the core 103. The barrier material 115 may be deposited using any suitable technique, including lamination, atomic layer deposition (ALD), or physical vapor deposition (PVD).

FIG. 4F illustrates an assembly subsequent to plating a conductive material, such as copper, in the via openings 111 of FIG. 4E to form TGVs 110, and forming a first RDL 148-1 on the first surface 170-1 of the core 103 and a second RDL 148-2 on the second surface 170-2 of the core 103. The RDLs 148, including the first and second RDLs 148-1, 148-2, may include conductive pathways 196 between first conductive contacts 172 and second conductive contacts 174. The RDL 148 may be manufactured using any suitable technique, such as a PCB technique or a redistribution layer technique.

Figure 4G:
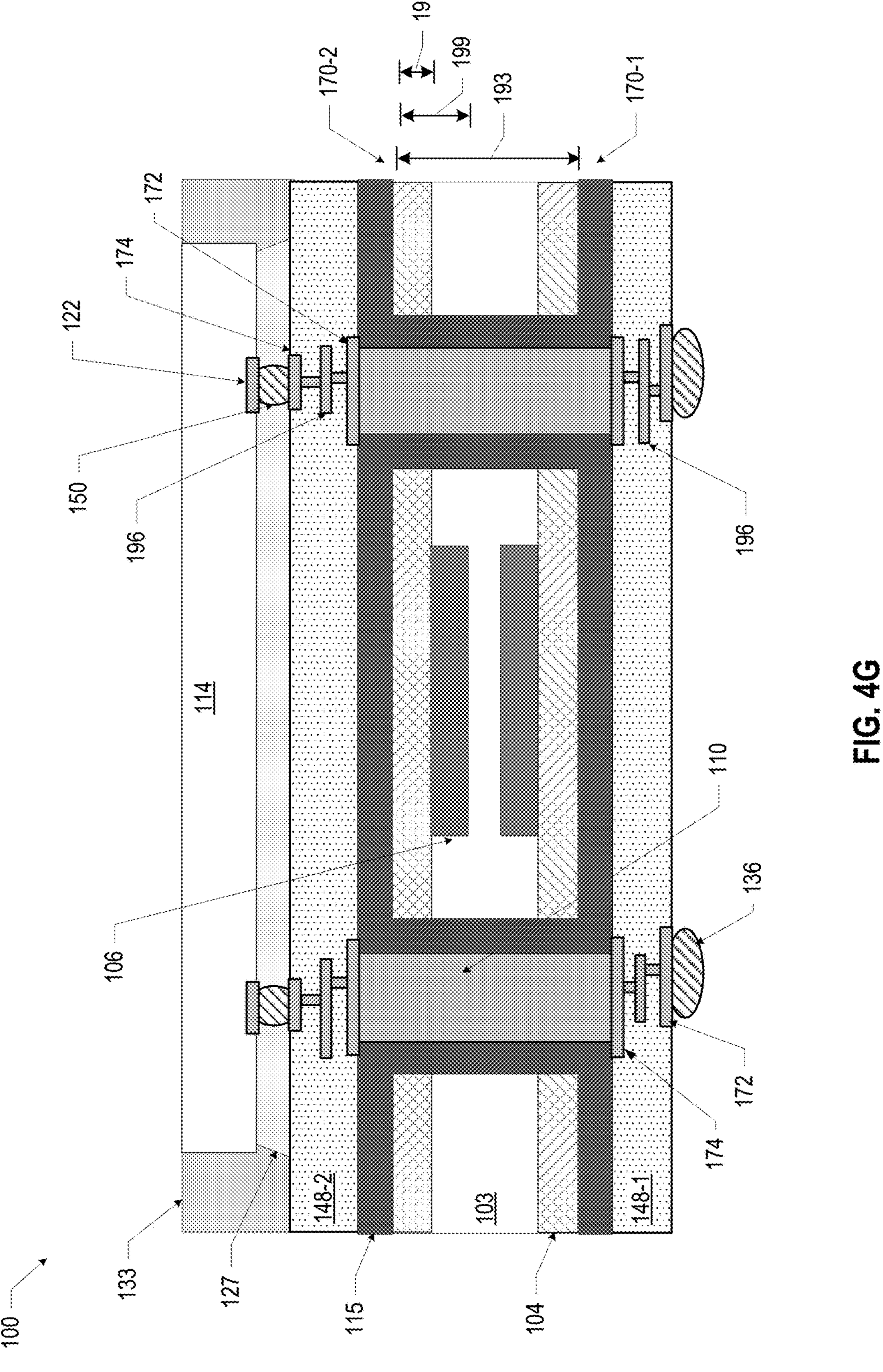

FIG. 4G illustrates an assembly subsequent to electrically coupling the die 114 to the second RDL 148-2 by forming interconnects 150, overmolding the die 114 with an insulating material 133, and performing finishing operations. Any suitable method may be used to place die 114, for example, automated pick-and-place. The assembly of FIG. 4G may be subjected to a solder reflow process during which solder (e.g., solder 132 of FIG. 2) of the interconnects 150 melt and bond to mechanically and electrically couple die 114 to the second RDL 148-2. In some embodiments, the insulating material 133 may be deposited to completely cover the die 114 and the overburden of insulating material 133 may be removed to expose a top surface of the die 114. The insulating material 133 may be removed using any suitable technique, including etching, mechanical milling, or laser ablation. In some embodiments, an underfill material 127 may be deposited around interconnects 150 prior to overmolding with the insulating material 133. Multiple assemblies may be manufactured together and may be singulated. The multiple assemblies may be singulated using any suitable process, such as a glass dice saw or a laser. Example finishing operations include depositing solder resist (not shown) and depositing solder 136 on a bottom surface of conductive contacts 172 of the first RDL 148-1. The assembly of FIG. 4G may itself be a microelectronic assembly 100, as shown. Further manufacturing operations may be performed on the microelectronic assembly 100 of FIG. 4G to form other microelectronic assembly 100. For example, the solder 136 of microelectronic assembly 100 of FIG. 4G may be electrically coupled to a circuit board 131 to form interconnects 190, similar to the microelectronic assembly 100 of FIG. 2.

Figure 5:
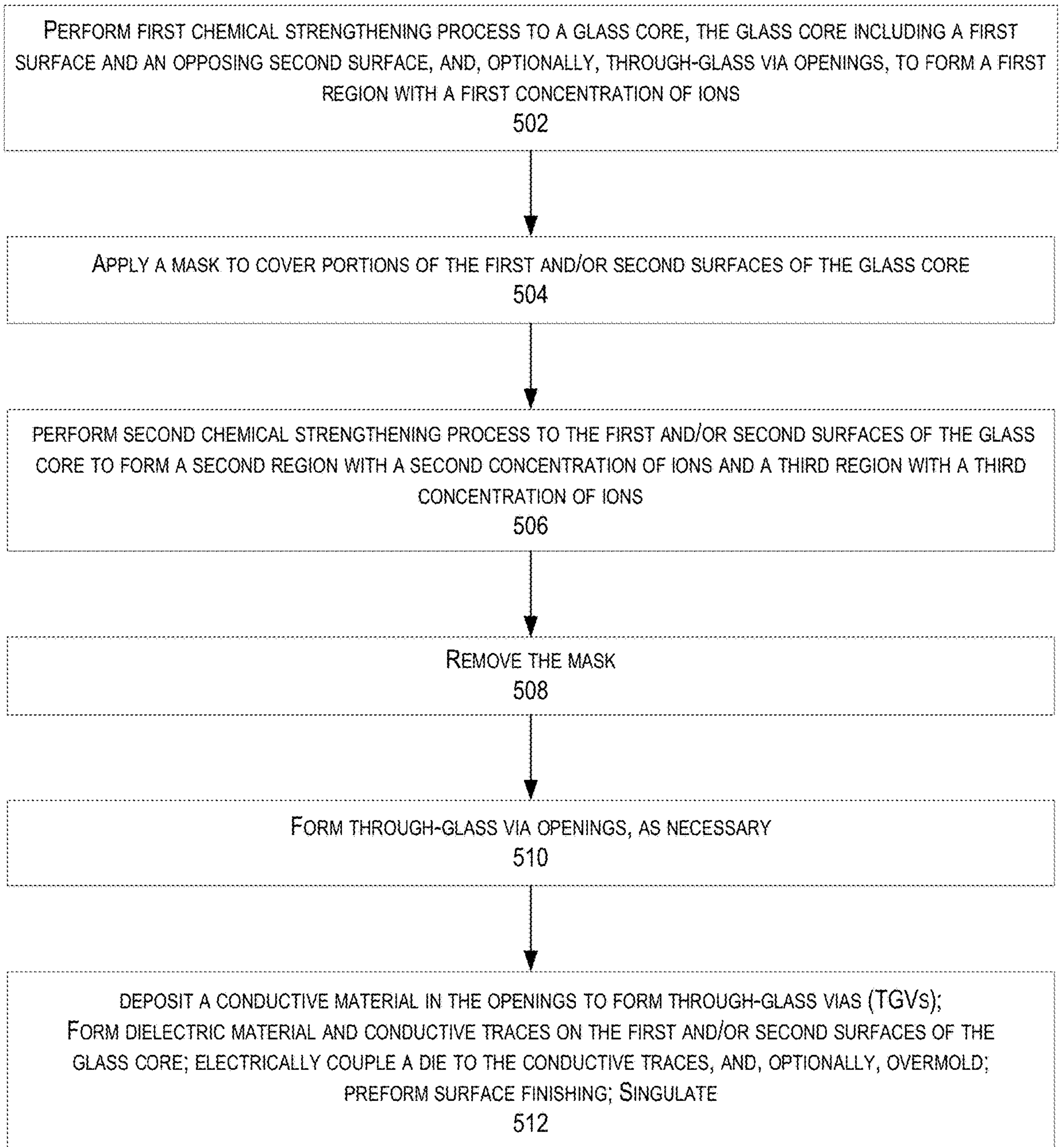
FIG. 5 is a schematic flow diagram listing example operations that may be associated with fabricating a microelectronic assembly according to some embodiments of the present disclosure.

FIG. 5 is a flow diagram of an example method of fabricating an example microelectronic assembly of FIGS. 1 and 2, in accordance with various embodiments. At 502, a glass core 103 having a first surface 170-1 and an opposing second surface 170-2 may be subjected to a first chemical strengthening process 113-1 to form a first region 105 with a first concentration of ions. In some embodiments, the glass core 103 may further include via openings 111. At 504, a mask 117 may be applied to the first and/or second surfaces 170-1, 170-2 of the glass core 103. At 506, the assembly may be subjected to a second chemical process 113-2 to form a second region 107 with a second concentration of ions and a third region with a third concentration of ions. At 508, the mask 117 may be removed, for example, by etching or grinding. At 510, if not formed at 502, via openings 111 may be formed, for example, by laser drilling and wet etching. At 512, a conductive material may be deposited in the via openings 111 to form TGVs 110, a dielectric material including conductive pathways 196 (e.g., an RDL 148) may be formed on the first and second surfaces 170-1, 170-2 of the glass core 103, a die 114 may be electrically coupled to conductive contacts 174 of the second RDL 148-2 by forming interconnects 150, an underfill material 127 may be dispensed around interconnects 150, an insulating material 133 may be deposited on and around the die 114, surface finishing operations may be performed, and assemblies may be singulated, as necessary. Surface finishing operations may include, for example, dispensing solder resist and attaching solder balls. Further manufacturing operations may be performed, for example, the solder 136 may be electrically coupled to a circuit board 131 to form interconnects 190, similar to the microelectronic assembly 100 of FIGS. 1A and 1B.

Figure 6:
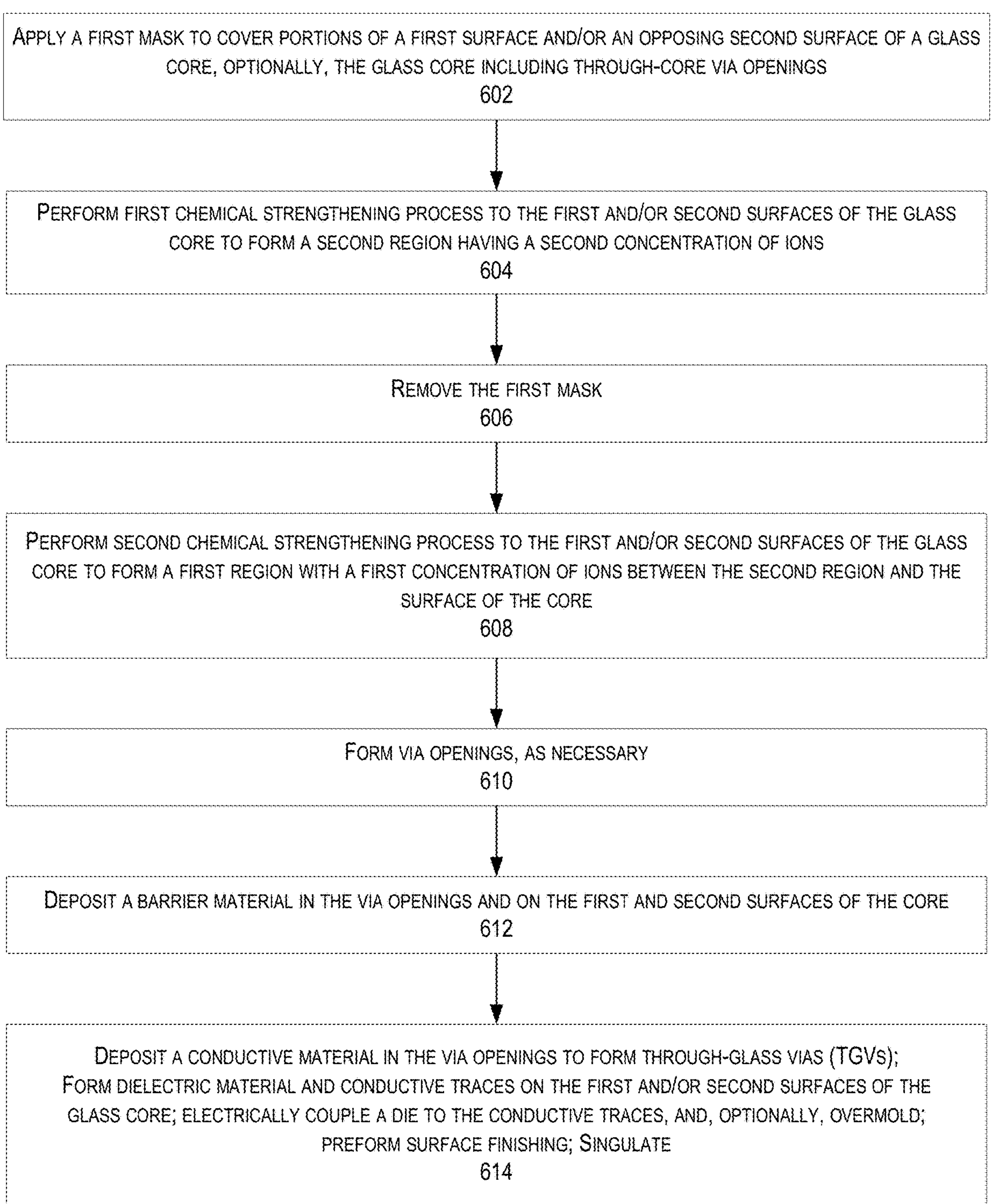
FIG. 6 is a schematic flow diagram listing example operations that may be associated with fabricating a microelectronic assembly according to some embodiments of the present disclosure.

FIG. 6 is a flow diagram of an example method of fabricating an example microelectronic assembly of FIG. 2, in accordance with various embodiments. At 602, a mask 119 may be applied to a first surface 170-1 and/or an opposing second surface 170-2 of a glass core 103. In some embodiments, the glass core 103 may further include via openings 111. At 604, the glass core 103 and the mask 119 may be subjected to a first chemical strengthening process 123-1, such as a first ion-implant process, to form a second region 106 with a second concentration of ions. At 606, the mask 119 may be removed, for example, by etching or grinding. At 608, the glass core 103 may be subjected to a second chemical strengthening process 123-2, such as a second ion-implant process, to form a first region 104 with a first concentration of ions and that moves the second region 106 deeper into the core 103, such that the first region 104 is between the second region 106 and the surface 170 of the core 103. At 610, if not formed at 602, via openings 111 may be formed, for example, by laser drilling and wet etching. At 612, a barrier material 115 may be deposited in the via openings 111 and on the first and second surfaces 170-1, 170-2 of the core 103. At 614, a conductive material may be plating in the via openings 111 to form TGVs 110, a dielectric material including conductive pathways 196 (e.g., an RDL 148) may be formed on the first and second surfaces 170-1, 170-2 of the glass core 103, a die 114 may be electrically coupled to conductive contacts 174 of the second RDL 148-2 by forming interconnects 150, an underfill material 127 may be dispensed around interconnects 150, an insulating material 133 may be deposited on and around the die 114, surface finishing operations may be performed, and assemblies may be singulated, as necessary. Surface finishing operations may include, for example, dispensing solder resist and attaching solder balls. Further manufacturing operations may be performed, for example, the solder 136 may be electrically coupled to a circuit board 131 to form interconnects 190, similar to the microelectronic assembly 100 of FIG. 2.

Figure 7:
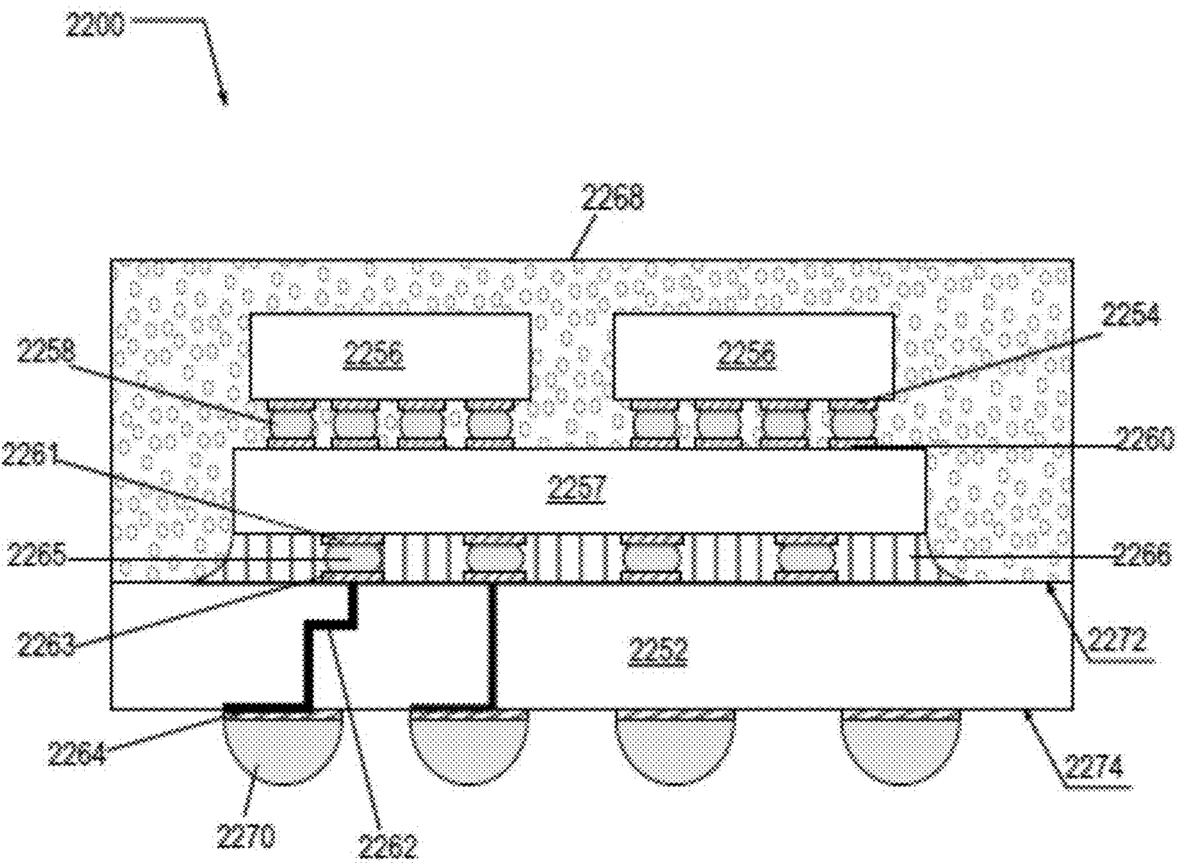
FIG. 7 is a cross-sectional view of a device package that may include one or more microelectronic assemblies in accordance with any of the embodiments disclosed herein.
Figure 8:
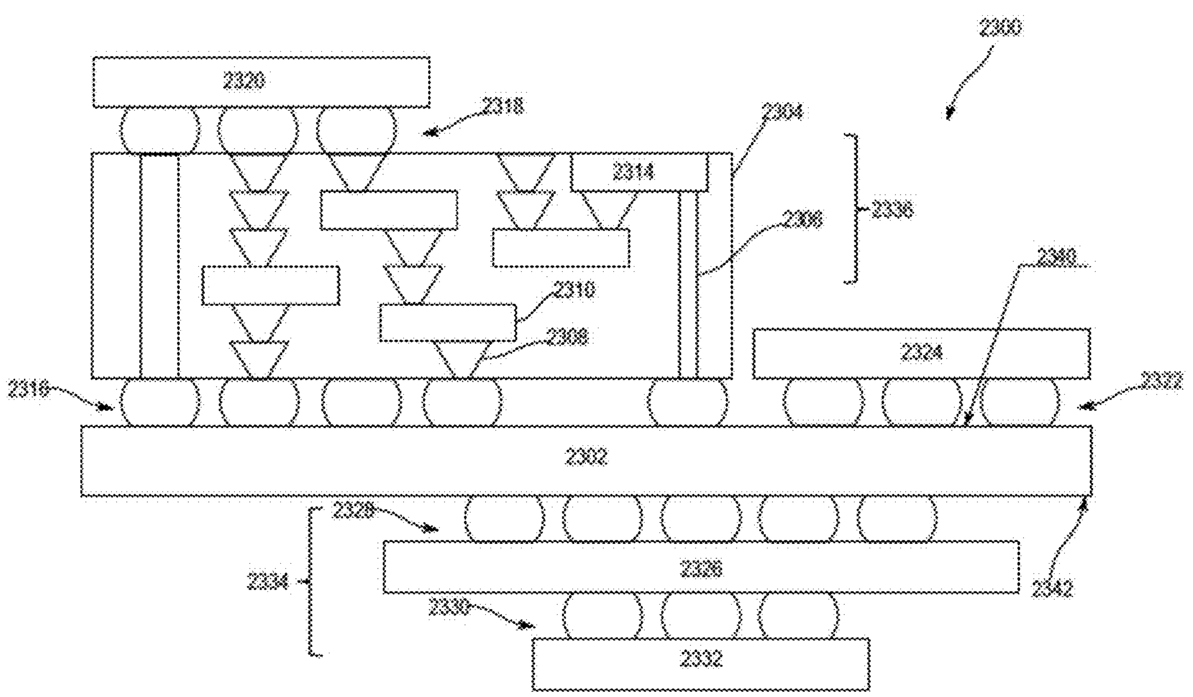
FIG. 8 is a cross-sectional side view of a device assembly that may include one or more microelectronic assemblies in accordance with any of the embodiments disclosed herein.
Figure 9:
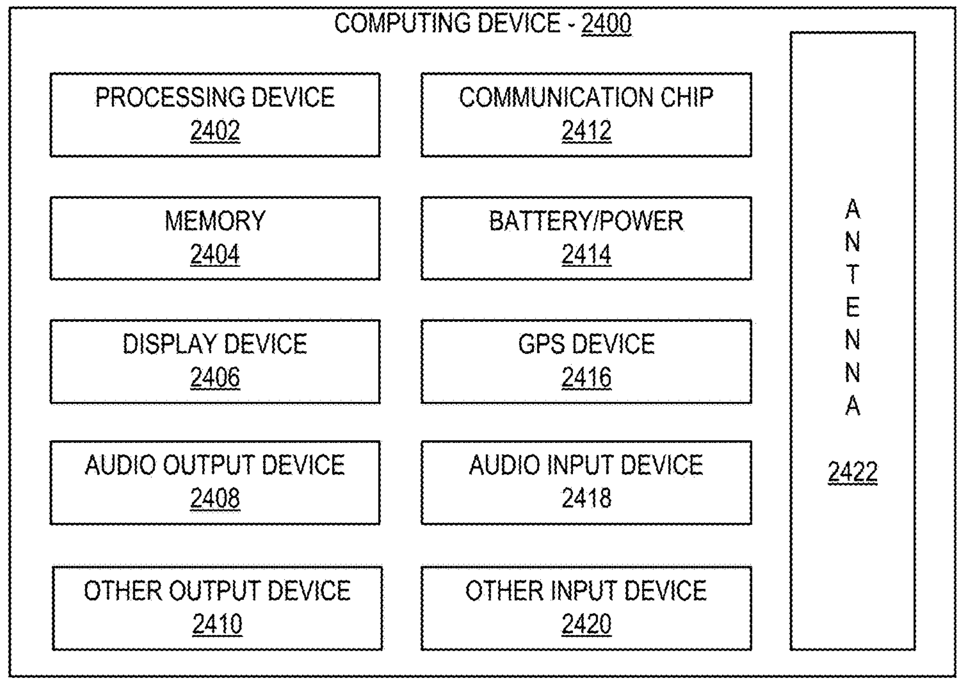
FIG. 9 is a block diagram of an example computing device that may include one or more microelectronic assemblies in accordance with any of the embodiments disclosed herein.

The packages disclosed herein, e.g., any of the microelectronic assemblies 100, or any further embodiments described herein, may be included in any suitable electronic component. FIGS. 7-9 illustrate various examples of packages, assemblies, and devices that may be used with or include any of the IC packages as disclosed herein.

FIG. 7 is a side, cross-sectional view of an example IC package 2200 that may include microelectronic assemblies in accordance with any of the embodiments disclosed herein. In some embodiments, the IC package 2200 may be a system-in-package (SiP).

As shown in FIG. 7, package support 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias, e.g., as discussed above with reference to FIG. 1A.

Package support 2252 may include conductive contacts 2263 that are coupled to conductive pathway 2262 through package support 2252, allowing circuitry within dies 2256 and/or interposer 2257 to electrically couple to various ones of conductive contacts 2264 (or to other devices included in package support 2252, not shown).

IC package 2200 may include interposer 2257 coupled to package support 2252 via conductive contacts 2261 of interposer 2257, first level interconnects (FLI) 2265, and conductive contacts 2263 of package support 2252. FLI 2265 illustrated in FIG. 7 are solder bumps, but any suitable FLI 2265 may be used, such as solder bumps, solder posts, or bond wires.

IC package 2200 may include one or more dies 2256 coupled to interposer 2257 via conductive contacts 2254 of dies 2256, FLI 2258, and conductive contacts 2260 of interposer 2257. In various embodiments, interposer 2257 may include core 103 comprising glass as described herein. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). FLI 2258 illustrated in FIG. 7 are solder bumps, but any suitable FLI 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package support 2252 and interposer 2257 around FLI 2265, and mold 2268 may be disposed around dies 2256 and interposer 2257 and in contact with package support 2252. In some embodiments, underfill material 2266 may be the same as mold 2268. Example materials that may be used for underfill material 2266 and mold 2268 are epoxies as suitable. Second level interconnects (SLI) 2270 may be coupled to conductive contacts 2264. SLI 2270 illustrated in FIG. 7 are solder balls (e.g., for a ball grid array (BGA) arrangement), but any suitable SLI 2270 may be used (e.g., pins in a pin grid array arrangement or lands in a land grid array arrangement). SLI 2270 may be used to couple IC package 2200 to another component, such as a circuit board (e.g., a motherboard), an interposer, or another IC package, as known in the art and as discussed below with reference to FIG. 9.

In embodiments in which IC package 2200 includes multiple dies 2256, IC package 2200 may be referred to as a multichip package (MCP). Dies 2256 may include circuitry to perform any desired functionality. For example, besides one or more of dies 2256 comprising components of dies 114 as described herein, one or more of dies 2256 may be logic dies (e.g., silicon-based dies), one or more of dies 2256 may be memory dies (e.g., high-bandwidth memory), etc. In some embodiments, at least some of dies 2256 may not include components of dies 114 as described herein.

Although IC package 2200 illustrated in FIG. 7 is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package support 2252, or on either face of interposer 2257. More generally, IC package 2200 may include any other active or passive components known in the art.

FIG. 8 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 7.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package support.

FIG. 8 illustrates that, in some embodiments, IC device assembly 2300 may include a package-on-interposer structure 2336 coupled to first face 2340 of circuit board 2302 by coupling components 2316. Although not shown so as not to clutter the drawing, package-on-interposer structure 2336 may comprise a glass core, such as core 103 in some embodiments. In other embodiments, package-on-interposer structure 2336 may not comprise any glass core. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. In some embodiments, IC package 2320 may comprise microelectronic assembly 100, including strengthened core 103, and other components as described herein, which are not shown so as not to clutter the drawing. Coupling components 2318 may take any suitable form depending on desired functionalities, such as the forms discussed above with reference to coupling components 2316. In some embodiments, IC package 2320 may be or include IC package 2200, e.g., as described above with reference to FIG. 7.

Although a single IC package 2320 is shown in FIG. 8, multiple IC packages may be coupled to interposer 2304; indeed, additional interposers may be coupled to interposer 2304. Interposer 2304 may provide an intervening package support used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in FIG. 8, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 9 is a block diagram of an example computing device 2400 that may include one or more components having one or more IC packages in accordance with any of the embodiments disclosed herein. For example, any suitable ones of the components of computing device 2400 may include microelectronic assembly 100 including a strengthened core 103 comprising glass in accordance with any of the embodiments disclosed herein. In another example, any one or more of the components of computing device 2400 may include any embodiments of IC package 2200 (e.g., as shown in FIG. 7). In yet another example, any one or more of the components of computing device 2400 may include an IC device assembly 2300 (e.g., as shown in FIG. 8).

A number of components are illustrated in FIG. 9 as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in FIG. 9, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips; note that the terms "chip," "die," and "IC die" are used interchangeably herein). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives of it, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The following paragraphs provide various examples of the embodiments disclosed herein.

Example 1 is a microelectronic assembly, including a core having a surface and made of glass, the core including a first region having a first concentration of ions and a second region having a second concentration of ions at the surface of the core; and a third region having a third concentration of ions, wherein the second region is between the third region and the surface of the core, and wherein the third concentration of ions is less than the first and second concentrations of ions; a dielectric with a conductive pathway at the surface of the core; and a die electrically coupled to the conductive pathway in the dielectric at the surface of the core by an interconnect.

Example 2 may include the subject matter of Example 1, and may further specify that the first region extends to a first depth from the surface of the core and the first depth is between 2 nanometers and 50 microns.

Example 3 may include the subject matter of Examples 1 or 2, and may further specify that the second region extends to a second depth from the surface of the core and the second depth is between 2 nanometers and 50 microns.

Example 4 may include the subject matter of any of Examples 1-3, and may further specify that the third region extends to a third depth from the surface of the core and the third depth is between 2 nanometers and 100 microns.

Example 5 may include the subject matter of any of Examples 1-4, and may further specify that the ions of the first, second, and third regions include ions of nitrogen, hydrogen, helium, copper, nickel, gold, silver, titanium, oxygen, carbon, boron, phosphorus, arsenic, gallium, or argon, and combinations thereof.

Example 6 may include the subject matter of any of Examples 1-5, and may further specify that the core further includes a through-glass via (TGV).

Example 7 may include the subject matter of Example 6, and may further specify that the surface of the core is a second surface and the core further includes a first surface opposite the second surface, and the dielectric is a second dielectric having a second conductive pathway, and the microelectronic assembly may further include a first dielectric with a first conductive pathway at the first surface of the core, wherein the TGV is electrically coupled to the first and second conductive pathways.

Example 8 is a microelectronic assembly, including a core made of glass and having a first surface and an opposing second surface, the core including a first region having a first concentration of ions extending from the second surface of the core to a first depth; a second region having a second concentration of ions extending from the second surface of the core to a second depth, where the first region is between the second region and the second surface of the core; a through-glass via (TGV); and a material layer on the first and second surfaces of the core and along a lateral surface of the TGV; and a die at the second surface of the core and electrically coupled to the TGV by an interconnect.

Example 9 may include the subject matter of Example 8, and may further specify that the first depth is between 2 nanometers and 50 microns.

Example 10 may include the subject matter of Examples 8 or 9, and may further specify that the second depth is between 2 nanometers and 100 microns.

Example 11 may include the subject matter of any of Examples 8-10, and may further specify that a thickness of the material layer is between 2 microns and 20 microns.

Example 12 may include the subject matter of any of Examples 8-11, and may further specify that the ions of the first and second regions include ions of metal nanoparticles.

Example 13 may include the subject matter of any of Examples 8-12, and may further specify that the material layer includes silicon and nitrogen, silicon and oxygen, tantalum, tantalum and nitrogen, or titanium and nitrogen.

Example 14 may include the subject matter of any of Examples 8-13, and may further include a circuit board electrically coupled to the first surface of the core.

Example 15 is a microelectronic assembly, including a core made of glass and having a first surface and an opposing second surface, the core including a first region having a first concentration of ions extending from the respective first and second surfaces of the core to a first depth; a second region having a second concentration of ions different than the first concentration of ions, the second region extending from the respective first and second surfaces of the core to a second depth; a third region having a third concentration of ions different than the first and second concentration of ions, the third region extending from the respective first and second surfaces of the core to a third depth, wherein the second region is between the third region and the respective first and second surfaces of the core; and a through-glass via (TGV); a dielectric with a conductive pathway at the second surface of the core, wherein the conductive pathway in the dielectric is electrically coupled to the TGV; and a die electrically coupled to the conductive pathway by an interconnect.

Example 16 may include the subject matter of Example 15, and may further specify that the first concentration of ions greater than the second concentration of ions.

Example 17 may include the subject matter of Examples 15 or 16, and may further specify that the ions of the first, second, and third regions include ions of nitrogen, hydrogen, helium, copper, nickel, gold, silver, titanium, oxygen, carbon, boron, phosphorus, arsenic, gallium, or argon, and combinations thereof.

Example 18 may include the subject matter of any of Examples 15-17, and may further specify that the first depth is between 2 nanometers and 50 microns.

Example 19 may include the subject matter of any of Examples 15-18, and may further specify that the second depth is between 2 nanometers and 50 microns.

Example 20 may include the subject matter of any of Examples 15-19, and may further specify that the second depth is equal to the first depth.

Example 21 may include the subject matter of any of Examples 15-20, and may further specify that the third depth is between 2 nanometers and 100 microns.

Example 22 may include the subject matter of any of Examples 15-21, and may further specify that the first region at the first surface of the core includes first ions and the first region at the second surface of the core includes second ions different from the first ions.

Example 23 may include the subject matter of any of Examples 15-22, and may further include an insulating material surrounding the die.

The invention claimed is:

1. A microelectronic assembly, comprising:
- a core having a surface and made of glass, the core including:
  - a first region having a first concentration of ions and a second region having a second concentration of ions at the surface of the core; and
  - a third region having a third concentration of ions, wherein the second region is between the third region and the surface of the core, and wherein the third concentration of ions is less than the first and second concentrations of ions;
- a dielectric with a conductive pathway at the surface of the core; and
- a die electrically coupled to the conductive pathway in the dielectric at the surface of the core by an interconnect.

2. The microelectronic assembly of claim 1, wherein the first region extends to a first depth from the surface of the core and the first depth is between 2 nanometers and 50 microns.

3. The microelectronic assembly of claim 1, wherein the second region extends to a second depth from the surface of the core and the second depth is between 2 nanometers and 50 microns.

4. The microelectronic assembly of claim 1, wherein the third region extends to a third depth from the surface of the core and the third depth is between 2 nanometers and 100 microns.

5. The microelectronic assembly of claim 1, wherein the ions of the first, second, and third regions include ions of nitrogen, hydrogen, helium, copper, nickel, gold, silver, titanium, oxygen, carbon, boron, phosphorus, arsenic, gallium, or argon, and combinations thereof.

6. The microelectronic assembly of claim 1, wherein the core further includes a through-glass via (TGV).

7. The microelectronic assembly of claim 6, wherein the surface of the core is a second surface and the core further includes a first surface opposite the second surface, and the dielectric is a second dielectric having a second conductive pathway, and the microelectronic assembly further comprising:
- a first dielectric with a first conductive pathway at the first surface of the core, wherein the TGV is electrically coupled to the first and second conductive pathways.

8. A microelectronic assembly, comprising:
- a core made of glass and having a first surface and an opposing second surface, the core including:
  - a first region having a first concentration of ions extending from the second surface of the core to a first depth;
  - a second region having a second concentration of ions extending from the second surface of the core to a second depth, where the first region is between the second region and the second surface of the core;
  - a through-glass via (TGV); and
  - a material layer on the first and second surfaces of the core and along a lateral surface of the TGV; and
- a die at the second surface of the core and electrically coupled to the TGV by an interconnect.

9. The microelectronic assembly of claim 8, wherein the first depth is between 2 nanometers and 50 microns.

10. The microelectronic assembly of claim 8, wherein the second depth is between 2 nanometers and 100 microns.

11. The microelectronic assembly of claim 8, wherein a thickness of the material layer is between 2 microns and 20 microns.

12. The microelectronic assembly of claim 8, wherein the ions of the first and second regions include ions of metal nanoparticles.

13. The microelectronic assembly of claim 8, wherein the material layer includes silicon and nitrogen, silicon and oxygen, tantalum, tantalum and nitrogen, or titanium and nitrogen.

14. The microelectronic assembly of claim 8, further comprising:
- a circuit board electrically coupled to the first surface of the core.

15. A microelectronic assembly, comprising:
- a core made of glass and having a first surface and an opposing second surface, the core including:
  - a first region having a first concentration of ions extending from the respective first and second surfaces of the core to a first depth;
  - a second region having a second concentration of ions different than the first concentration of ions, the second region extending from the respective first and second surfaces of the core to a second depth;
  - a third region having a third concentration of ions different than the first and second concentration of ions, the third region extending from the respective first and second surfaces of the core to a third depth, wherein the second region is between the third region and the respective first and second surfaces of the core; and
  - a through-glass via (TGV);
- a dielectric with a conductive pathway at the second surface of the core, wherein the conductive pathway in the dielectric is electrically coupled to the TGV; and
- a die electrically coupled to the conductive pathway by an interconnect.

16. The microelectronic assembly of claim 15, wherein the first concentration of ions greater than the second concentration of ions.

17. The microelectronic assembly of claim 15, wherein the ions of the first, second, and third regions include ions of nitrogen, hydrogen, helium, copper, nickel, gold, silver, titanium, oxygen, carbon, boron, phosphorus, arsenic, gallium, or argon, and combinations thereof.

18. The microelectronic assembly of claim 15, wherein the second depth is equal to the first depth.

19. The microelectronic assembly of claim 15, wherein the first region at the first surface of the core includes first ions and the first region at the second surface of the core includes second ions different from the first ions.

20. The microelectronic assembly of claim 15, further comprising:

an insulating material surrounding the die.

* * * * *